US012412000B2

(12) United States Patent
Sinha et al.

(10) Patent No.: US 12,412,000 B2
(45) Date of Patent: Sep. 9, 2025

(54) AUTOMATIC EXTRACTION OF ASSETS DATA FROM ENGINEERING DATA SOURCES FOR GENERATING AN HMI

(71) Applicant: Schneider Electric Systems USA, Inc., Foxborough, MA (US)

(72) Inventors: Bhaskar Sinha, Hyderabad (IN); Padmaja Bodanapu, Telangana (IN); Ashish Patil, Maharashtra (IN); Sameer Kondejkar, Maharashtra (IN); Rajkumar Krishnan, Sharon, MA (US)

(73) Assignee: SCHNEIDER ELECTRIC SYSTEMS USA, INC., Boston, MA (US)

( * ) Notice: Subject to any disclaimer, the term of this patent is extended or adjusted under 35 U.S.C. 154(b) by 953 days.

(21) Appl. No.: 17/442,437

(22) PCT Filed: Mar. 24, 2020

(86) PCT No.: PCT/US2020/024506
§ 371 (c)(1),
(2) Date: Sep. 23, 2021

(87) PCT Pub. No.: WO2020/198254
PCT Pub. Date: Oct. 1, 2020

(65) Prior Publication Data
US 2022/0197272 A1   Jun. 23, 2022

Related U.S. Application Data

(60) Provisional application No. 62/842,929, filed on May 3, 2019, provisional application No. 62/823,469, filed
(Continued)

(51) Int. Cl.
G06N 5/022 (2023.01)
G05B 17/02 (2006.01)
(Continued)

(52) U.S. Cl.
CPC ............ G06F 30/12 (2020.01); G05B 17/02 (2013.01); G05B 19/0426 (2013.01);
(Continued)

(58) Field of Classification Search
CPC ......... G06F 30/12; G06F 30/27; G05B 17/02; G05B 19/0426; G05B 19/41885;
(Continued)

(56) References Cited

U.S. PATENT DOCUMENTS 8,365,019 B2   1/2013   Sailer et al.
8,370,224 B2   2/2013   Grewal
(Continued)

FOREIGN PATENT DOCUMENTS

CN   104914807 A1   9/2015
CN   105589349 A    5/2016
(Continued)

OTHER PUBLICATIONS

Iyun "Plant-Wide Diagnosis: Cause-and-Effect Analysis Using Process Connectivity and Directionality Information", retrieved from https://core.ac.uk/download/1592216.pdf and dated Oct. 2011 (Year: 2011).*
(Continued)

*Primary Examiner* — Sanchita Roy
(74) *Attorney, Agent, or Firm* — Troutman Pepper Locke LLP

(57) ABSTRACT

Systems and methods for controlling industrial process automation and control systems can automatically, through the use of machine learning (ML) models and algorithms, extract plant assets from engineering diagrams and other plant engineering data sources. The systems and methods can establish asset relationships to create a plant asset registry and build an asset hierarchy from the plant assets. The systems and methods can generate an ontological
(Continued)

knowledge base from the plant asset hierarchy, and provide an HMI for controlling the industrial process based on the plant asset hierarchy and the ontological knowledge base.

22 Claims, 40 Drawing Sheets

Related U.S. Application Data on Mar. 25, 2019, provisional application No. 62/823,377, filed on Mar. 25, 2019.

(51) Int. Cl.
    *G05B 19/042*     (2006.01)
    *G05B 19/418*     (2006.01)
    *G05B 23/02*     (2006.01)
    *G06F 30/12*     (2020.01)
    *G06F 30/27*     (2020.01)

(52) U.S. Cl.
    CPC ... *G05B 19/41885* (2013.01); *G05B 23/0221* (2013.01); *G05B 23/0243* (2013.01); *G05B 23/027* (2013.01); *G05B 23/0272* (2013.01); *G05B 23/0281* (2013.01); *G06F 30/27* (2020.01); *G06N 5/022* (2013.01); *G05B 2219/23008* (2013.01); *G05B 2219/23067* (2013.01); *G05B 2219/23272* (2013.01); *G05B 2219/23278* (2013.01)

(58) Field of Classification Search
    CPC ............ G05B 23/0221; G05B 23/0243; G05B 23/027; G05B 23/0272; G05B 23/0281; G05B 2219/23008; G05B 2219/23067; G05B 2219/23272; G05B 2219/23278; G06N 5/022
See application file for complete search history.

(56) References Cited

U.S. PATENT DOCUMENTS

| | | | |
|---|---|---|---|
| 9,177,398 B2 | 11/2015 | Bierweiler et al. | |
| 9,825,818 B2 | 11/2017 | Tiwari et al. | |
| 11,756,323 B2 | 9/2023 | Kang et al. | |
| 2009/0328215 A1 | 12/2009 | Arzi et al. | |
| 2010/0318846 A1* | 12/2010 | Sailer | G06F 11/0748 706/46 |
| 2012/0062574 A1 | 3/2012 | Dhoolia et al. | |
| 2012/0259436 A1* | 10/2012 | Resurreccion | G05B 19/0428 700/17 |
| 2015/0220076 A1 | 8/2015 | Uchida | |
| 2015/0242286 A1* | 8/2015 | Grewal | G05B 19/418 707/654 |
| 2015/0261215 A1 | 9/2015 | Blevins et al. | |
| 2016/0132538 A1 | 5/2016 | Bliss et al. | |
| 2016/0292895 A1 | 10/2016 | Billi et al. | |
| 2017/0192407 A1 | 7/2017 | Kurella et al. | |
| 2017/0329322 A1 | 11/2017 | Downor | |
| 2017/0351226 A1 | 12/2017 | Bliss et al. | |
| 2018/0113442 A1 | 4/2018 | Nixon et al. | |
| 2018/0137424 A1* | 5/2018 | Gabaldon Royval | G06N 5/022 |
| 2020/0175372 A1 | 6/2020 | Sharma et al. | |

FOREIGN PATENT DOCUMENTS

| | | |
|---|---|---|
| CN | 106020138 A | 10/2016 |
| CN | 107976969 | 5/2018 |
| JP | 2017533645 A | 11/2017 |
| JP | 2019101514 A | 12/2021 |
| WO | 2019023982 A1 | 2/2019 |

OTHER PUBLICATIONS

International Search Report for PCT Application No. PCT/US2020/024506 dated Jun. 3, 2020.
Written Opinion for PCT Application No. PCT/US2020/024506 dated Jun. 3, 2020.
Fleischmann, Hans, et al. "Automated generation of human-machine interfaces in electric drives manufacturing." 2017 7th International Electric Drives Production Conference (EDPC). IEEE, 2017.
Rahul, Rohit, et al. "Automatic information extraction from piping and instrumentation diagrams." arXiv preprint arXiv:1901.11383 (2019).
International Electrotechnical Commission. "Engineering data exchange format for use in industrial automation systems engineering—Automation Markup Language—Part 1: Architecture and general requirements." International Standard, Rev 1 (2018): 62714-1.
Examination Report for EP Application No. 20720224.3 dated Mar. 28, 2024.
Markus Schleburg et al., A Combined Analysis of Plant Connectivity and Alarm Logs to Reduce the Number of Alerts in an Automation System, Journal of Process Control, Oxford, GB, vol. 23, No. 6, May 31, 2013.
EP Extended Search Report for EP Application No. 20720593.1 dated Sep. 28, 2021.
EP Extended Search Report for EP Application No. 20719074.5 dated Oct. 6, 2021.
EP Extended Search Report for EP Application No. 23210388.7 dated Feb. 27, 2024.
PCT Search Report and PCT Written Opinion for PCT/US2020/024501 dated Jun. 17, 2020.
PCT Search Report and PCT Written Opinion for PCT/US2020/024502 dated Feb. 3, 2022.
Urbas et al., "Towards context adaptive HMIs in process industries", 2011 9th IEEE International Conference on Industrial Informatics Jul. 26, 2011 (pp. 244-249). IEEE.
Pang et al., "IEC 61499 based model-driven process control engineering", Proceedings of the 2014 IEEE Emerging Technology and Factory Automation (ETFA) Sep. 16, 2014 (pp. 1-8). IEEE.
Steinegger et al., "Automated code generation for programmable logic controllers based on knowledge acquisition from engineering artifacts: Concept and case study", Proceedings of 2012 IEEE 17th International Conference on Emerging Technologies & Factory Automation (ETFA 2012) Sep. 17, 2012 (pp. 1-8). IEEE.
Schuhmacher et al., "Knowledge-based graph document modeling." Proceedings of the 7th ACM international conference on Web search and data mining. 2014 (Year: 2014).
Louting Fu, "From engineering diagrams to engineering models: Visual recognition and applications" (Year: 2010).
Michal Ondrejcek, "Information Extraction from Scanned Engineering Drawings" (Year: 2009).
Koltun, Gennadiy, Moritz Kolter, and Birgit Vogel-Heuser. "Automated generation of modular PLC control software from P&ID diagrams in process industry." In 2018 IEEE International Systems Engineering Symposium (ISSE), pp. 1-8. IEEE, 2018. (Year: 2018).
Blevins, Terrence L., and Mark Nixon. Control loop foundation: batch and continuous processes. ISA, 2011. (Year: 2011).
Romero, David Dorantes, and Nina F. Thornhill. "Integration, navigation and exploration of plant topology networks using the property-graph model." In 2014 IEEE/SICE International Symposium on System Integration, pp. 743-748. IEEE, 2014. (Year: 2014).
Rantala, Miia, Hannu Niemist6, Tommi Karhela, Seppo Sierla, and Valeriy Vyatkin. "Applying graph matching techniques to enhance reuse of plant design information." Computers in Industry 107 (2019): 81-98. (Year: 2019).
Arroyo, Esteban, Mario Hoernicke, Pablo Rodriguez, and Alexander Fay. "Automatic derivation of qualitative plant simulation models from legacy piping and instrumentation diagrams." Computers & Chemical Engineering 92 (2016): 112-132. (Year: 2016).
Binford, T., T. Chen, J. Kunz, and K. H. Law. "Computer Interpretation of Process and Instrument." (Stanford, 1997). (Year: 1997).
Eppstein, D. "ICS 161: Design and analysis of algorithms lecture notes for Feb. 1, 1996." (UC Irvine, 1996). [Retrieved Online May 14, 2025] <https://ics.uci.edui-eppstein/161/960201.html > (Year: 1996).

(56) References Cited

OTHER PUBLICATIONS

ISA. "ANSI/ISA-88.01-1995, Batch Control, Part 1: Models and Terminology", (Instrument Society of America, 1995). ISBN: 1-55617-562-0 (Year: 1995).
ISO. "ISO-7200, Technical product documentation—Data fields in title blocks and document headers" (International Organization for Standardization, 2004) (Year: 2004).

* cited by examiner

|    | L1 | L2 | L3 | L4 | L5 |
|----|----|----|----|----|----|
| L1 | 0  | 1  | 0  | 0  | 0  |
| L2 | 1  | 0  | 1  | 0  | 0  |
| L3 | 0  | 1  | 0  | 1  | 0  |
| L4 | 0  | 0  | 1  | 0  | 1  |
| L5 | 0  | 0  | 0  | 1  | 0  |

| Nodes | Data |
|---|---|
| Node1 | E1 |
| Node2 | E2 |
| Node3 | E3 |
| Node4 | E4 |
| Node5 | L1 |
| Node6 | L5 |
| Node7 | L6 |
| Node8 | L7 |
| Node9 | L9 |

1204

| Edges | Data |
|---|---|
| Edge1 | (E1, L1) |
| Edge2 | (E2, L5) |
| Edge3 | (E1, L6) |
| Edge4 | (E3, L7) |
| Edge5 | (E4, L9) |

1206

| Nodes | Data |
|---|---|
| Node1 | C1 |
| Node2 | C2 |
| Node3 | Lc1 |
| Node4 | Lc2 |

1302

| Edges | Data |
|---|---|
| Edge1 | (C1, Lc1) |
| Edge2 | (Lc2, C2) |

1304

| Sr | Paths |
|---|---|
| 1 | C1->L1->L2->L3->E1 |
| 2 | C2->L4->L5->L6->E1 |
| 3 | C2->L4->L7->L8->E2 |
| 4 | E1->L13->L14->C3 |
| 5 | E1->L13->L15->L16->C4 |
| 6 | E2->L9->L10->L11->L12->C5 |

1308

1306

| Nodes | Data |
|-------|------|
| Node1 | D1 |
| Node2 | D2 |
| Node3 | L1 |
| Node4 | L2 |
| Node5 | L3 |
| Node6 | L4 |
| Node7 | L5 |

1402

| Edges | Data |
|-------|------|
| Edge1 | (D1, L1) |
| Edge2 | (D1, L2) |
| Edge3 | (D2, L3) |
| Edge4 | (D2, L4) |
| Edge5 | (D2, L5) |

1404

1602

| Graphs | Nodes | Edges |
|---|---|---|
| L-L | From L1 to L15 | (L1, L2), (L2, L3), (L4, L5), (L7, L8), (L9, L10), (L9, L12) |
| E-L | E1, E2<br>L5, L8, L9, L13, L14, L15 | (L5, E1), (L8, E1), (E1, L9), (L13, E2), (L14, E2), (E2, L15) |
| C-L | C1, C2, C3, C4<br>L1, L11, L14, L15 | (C1, L1), (L11, C2), (C3, L14), (L15, C4) |
| D-L | D1, D2, D3, D4<br>L3, L4, L6, L7, L10, L11, L12, L13 | (L3, D1), (D1, L4), (D1, L6), (L6, D2), (D2, L7), (L10, D3), (D3, L11), (L12, D4), (D4, L13) |
| P&ID Flow | From L1 to L15<br>From E1 to E2<br>From C1 to C4<br>From D1 to D4 | (C1, L1), (L1, L2), (L2, L3), (L3, D1), (D1, L4), (L4, L5), (L5, E1), (D1, L6), (L6, D2), (D2, L7), (L7, L8), (L8, E1), (E1, L9), (L9, L10), (L10, D3), (D3, L11), (L11, C2), (L9, L12), (L12, D4), (D4, L13), (L13, E2), (C3, L14), (L14, E2), (E2, L15), (L15, C4) |

1604

| EventTimeUtc | Priority | Severity | AlarmDurationMs | AlarmID | armOriginationTime | AlarmState | AlarmType | ReceivedTAlrm | Area | Tag |
|---|---|---|---|---|---|---|---|---|---|---|
| 00:02.9 | 500 | 2 | 3999 | AL_101 | 59:58.9 | UNACK_RTN | HiHi | 00:03.4 | DemoArea | 011900PV038 |
| 00:02.9 | 500 | 2 | 11499 | AL_102 | 59:51.4 | UNACK_RTN | Hi | 00:03.4 | DemoArea | 011900PT038 |
| 00:02.9 | 500 | 2 | NULL | AL_103 | 00:02.9 | UNACK_ALM | LoLo | 00:03.4 | DemoArea | 011900PV048 |
| 00:02.9 | 500 | 2 | NULL | AL_104 | 00:02.9 | UNACK_ALM | Lo | 00:03.4 | DemoArea | 011900PT048 |
| 00:04.9 | 500 | 2 | 41501 | AL_105 | 59:23.4 | UNACK_RTN | ROCHi | 00:05.4 | DemoArea | 011990FT021 |
| 00:04.9 | 500 | 2 | NULL | AL_106 | 00:04.9 | UNACK_ALM | ROCLo | 00:05.4 | DemoArea | 011990FT022 |
| 00:07.9 | 500 | 2 | 5001 | AL_107 | 00:02.9 | UNACK_RTN | LoLo | 00:08.3 | DemoArea | 011990FV021 |
| 00:10.0 | 500 | 2 | NULL | AL_108 | 00:09.9 | UNACK_ALM | ROCHi | 00:10.4 | DemoArea | 011990FV022 |
| 01:10.0 | 500 | 2 | 34002 | AL_109 | 00:35.9 | UNACK_RTN | Major | 01:10.3 | DemoArea | 011990FZ350 |
| 01:12.4 | 500 | 2 | 38999 | AL_110 | 00:33.5 | UNACK_RTN | Minor | 01:13.3 | DemoArea | 011990FZ351 |

Alarm Data

| Location | System | Cabinet | CabinetPartNumber | Rail | Rail Total Height/Width | Rail Consumed Height/Width |
|---|---|---|---|---|---|---|
| DemoLocation | DCS | DCS_SYS_CAB1 | G10xxxSYS | DCS_SYS_CAB1_Rail_A | 560 | 120.300 |
| DemoLocation | DCS | DCS_SYS_CAB1 | G10xxxSYS | DCS_SYS_CAB1_Rail_A | 560 | 120.300 |
| DemoLocation | DCS | DCS_SYS_CAB1 | G10xxxSYS | DCS_SYS_CAB1_Rail_A | 560 | 120.300 |
| DemoLocation | DCS | DCS_SYS_CAB1 | G10xxxSYS | DCS_SYS_CAB1_Rail_A | 560 | 120.300 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB1 | G10xxxSYS | DCS_SYS_CAB1_Rail_B | 450 | 443.6 |
| DemoLocation | DCS | DCS_SYS_CAB2 | G10xxxSYS | DCS_SYS_CAB2_Rail_A | 560 | 120.300 |
| DemoLocation | DCS | DCS_SYS_CAB2 | G10xxxSYS | DCS_SYS_CAB2_Rail_A | 560 | 120.300 |
| DemoLocation | DCS | DCS_SYS_CAB2 | G10xxxSYS | DCS_SYS_CAB2_Rail_A | 560 | 120.300 |

Cabinet Loading Report

FIG. 20

| Controller | Compound | Block | Application_IOM_ID | Application_FBM | Application_FBMType | Marshalling_IOM_ID | Marshalling_FBM | Marshalling_FBMType |
|---|---|---|---|---|---|---|---|---|
| CP2801 | CF101_011900 | PT038 | 801101 | 801101 | FBM214b | 801101 | 801101 | FBM214b |
| CP2801 | CF101_011900 | PV038 | 801102 | 801102 | FBM215 | 801102 | 801102 | FBM215 |
| CP2801 | CF101_011900 | PT048 | 801101 | 801101 | FBM214b | 801101 | 801101 | FBM214b |
| CP2801 | CF101_011900 | PV048 | 801102 | 801102 | FBM215 | 801102 | 801102 | FBM215 |
| CP2801 | CF101_011900 | LV061 | 801102 | 801102 | FBM215 | 801102 | 801102 | FBM215 |
| CP2801 | CF101_011900 | PT061 | 801102 | 801102 | FBM215 | 801102 | 801102 | FBM215 |
| CP2801 | CF101_011900 | FV021 | 801102 | 801102 | FBM215 | 801102 | 801102 | FBM215 |
| CP2801 | CF101_011900 | FV022 | 801102 | 801102 | FBM215 | 801102 | 801102 | FBM215 |
| CP2801 | CF101_011900 | FV021 | 801102 | 801102 | FBM215 | 801102 | 801102 | FBM215 |
| CP2801 | CF101_011900 | FV022 | 801102 | 801102 | FBM215 | 801102 | 801102 | FBM215 |

Control Database

FIG. 21

| Plant | Area | Unit | Location | System | Multicore | Tag | FromCabinet | FromRail | FromGroupName |
|---|---|---|---|---|---|---|---|---|---|
| DemoPlant | DemoArea | Unit1 | DemoLocation | DCS | 011900JT402CA | 011900PT038 | DCS_NIS_AI_AO_MAR_CAB1 | DCS_NIS_AI | E01 |
| DemoPlant | DemoArea | Unit1 | DemoLocation | DCS | 011900JT402CA | 011900PT038 | DCS_NIS_AI_AO_MAR_CAB1 | DCS_NIS_AI | E01 |
| DemoPlant | DemoArea | Unit1 | DemoLocation | DCS | 011900JT502CA | 011900PT048 | DCS_NIS_AI_AO_MAR_CAB1 | DCS_NIS_AI | E02 |
| DemoPlant | DemoArea | Unit1 | DemoLocation | DCS | 011900JT502CA | 011900PT048 | DCS_NIS_AI_AO_MAR_CAB1 | DCS_NIS_AI | E02 |
| DemoPlant | DemoArea | Unit1 | DemoLocation | DCS | 011900JT402CA | 011900PV038 | DCS_NIS_AI_AO_MAR_CAB1 | DCS_NIS_AI | E01 |
| DemoPlant | DemoArea | Unit1 | DemoLocation | DCS | 011900JT402CA | 011900PV038 | DCS_NIS_AI_AO_MAR_CAB1 | DCS_NIS_AI | E01 |
| DemoPlant | DemoArea | Unit1 | DemoLocation | DCS | 011900JT502CA | 011900PV048 | DCS_NIS_AI_AO_MAR_CAB1 | DCS_NIS_AI | E02 |
| DemoPlant | DemoArea | Unit1 | DemoLocation | DCS | 011900JT502CA | 011900PV048 | DCS_NIS_AI_AO_MAR_CAB1 | DCS_NIS_AI | E02 |
| DemoPlant | DemoArea | Unit2 | DemoLocation | DCS | 011900JT103CA | 011900FT021 | DCS_NIS_AI_AO_MAR_CAB1 | DCS_NIS_AI | E03 |
| DemoPlant | DemoArea | Unit2 | DemoLocation | DCS | 011900JT103CA | 011900FT021 | DCS_NIS_AI_AO_MAR_CAB1 | DCS_NIS_AI | E03 |
| DemoPlant | DemoArea | Unit2 | DemoLocation | DCS | 011900JT103CA | 011900FT022 | DCS_NIS_AI_AO_MAR_CAB1 | DCS_NIS_AI | E03 |
| DemoPlant | DemoArea | Unit2 | DemoLocation | DCS | 011900JT103CA | 011900FT022 | DCS_NIS_AI_AO_MAR_CAB1 | DCS_NIS_AI | E03 |
| DemoPlant | DemoArea | Unit2 | DemoLocation | DCS | 011900JT103CA | 011900FV021 | DCS_NIS_AI_AO_MAR_CAB1 | DCS_NIS_AI | E03 |
| DemoPlant | DemoArea | Unit2 | DemoLocation | DCS | 011900JT103CA | 011900FV021 | DCS_NIS_AI_AO_MAR_CAB1 | DCS_NIS_AI | E03 |
| DemoPlant | DemoArea | Unit2 | DemoLocation | DCS | 011900JT103CA | 011900FV022 | DCS_NIS_AI_AO_MAR_CAB1 | DCS_NIS_AI | E03 |
| DemoPlant | DemoArea | Unit2 | DemoLocation | DCS | 011900JT103CA | 011900FV022 | DCS_NIS_AI_AO_MAR_CAB1 | DCS_NIS_AI | E03 |
| DemoPlant | DemoArea | Unit2 | DemoLocation | DCS | 011900JT350CA | 011900LT061 | DCS_NIS_AI_AO_MAR_CAB1 | DCS_NIS_AI | E04 |
| DemoPlant | DemoArea | Unit2 | DemoLocation | DCS | 011900JT350CA | 011900LT061 | DCS_NIS_AI_AO_MAR_CAB1 | DCS_NIS_AI | E04 |
| DemoPlant | DemoArea | Unit2 | DemoLocation | DCS | 011900JT350CA | 011900LT061 | DCS_NIS_AI_AO_MAR_CAB1 | DCS_NIS_AI | E04 |

Cross Wiring Report

FIG. 22

| Plant | Area | Unit | CableName | SignalType | Tag |
|---|---|---|---|---|---|
| DemoPlant | DemoPlant | Unit1 | 011900JT402CA | AI-R | 011900PT038 |
| DemoPlant | DemoPlant | Unit1 | 011900JT402CA | AO-R | 011900PV038 |
| DemoPlant | DemoPlant | Unit2 | 011900JT103CA | AI-R | 011900FT021 |
| DemoPlant | DemoPlant | Unit2 | 011900JT103CA | AI-R | 011900FT022 |
| DemoPlant | DemoPlant | Unit2 | 011900JT103CA | AO-R | 011900FV021 |
| DemoPlant | DemoPlant | Unit2 | 011900JT103CA | AO-R | 011900FV022 |
| DemoPlant | DemoPlant | Unit2 | 011900JT106CA | AI-R | 011900LT061 |
| DemoPlant | DemoPlant | Unit2 | 011900JT106CA | AO-R | 011900LV061 |

Field Wiring Index

| Tag | Value | DateTime | Quality | OPCQuality |
|---|---|---|---|---|
| 011900PV038 | NULL | 00:01.0 | 1 | 0 |
| 011900PV038 | 56.20000076 | 00:00.0 | 0 | 192 |
| 011900PV038 | 55.5 | 00:00.0 | 0 | 192 |
| 011900PV048 | 57.79999924 | 00:00.0 | 0 | 192 |
| 011900PV048 | 55.90000153 | 00:00.0 | 0 | 192 |
| 011900PV048 | 55.79999924 | 00:00.0 | 0 | 192 |
| 011990FT021 | 56.09999847 | 00:00.0 | 0 | 192 |
| 011990FT022 | 55.59999847 | 00:00.0 | 0 | 192 |
| 011990FV021 | 55.09999847 | 00:00.0 | 0 | 192 |
| 011990FV021 | 65.59999847 | 00:00.0 | 0 | 192 |
| 011990FV022 | 57.09999847 | 00:00.0 | 0 | 192 |
| 011990FV022 | 57.29999924 | 00:00.0 | 0 | 192 |
| 011990FV022 | 53.79999924 | 00:00.0 | 0 | 192 |
| 011990LV061 | 57.09999847 | 00:00.0 | 0 | 192 |
| 011990LT061 | 62.59999847 | 00:00.0 | 0 | 192 |

Historical (Tag) Data

FIG. 24

| Plant | Area | Unit | LoopName | Tag | Service | Instrument Type | Instrument | InstrumentType Description | ProcessFun |
|---|---|---|---|---|---|---|---|---|---|
| DemoPlant | DemoArea | Unit1 | 011900P038 | 011900PV038 | Lean Meg to Well Fluid | CV | ControlValve01 | Control Valve | Control Valve |
| DemoPlant | DemoArea | Unit1 | 011900P038 | 011900PT038 | Lean Meg to Well Fluid | PT | PrarpessureTransmitter01 | Pressure Transmitter | Pressure |
| DemoPlant | DemoArea | Unit1 | 011900P048 | 011900PV048 | Lean Meg to Well Fluid | CV | ControlValve01 | Control Valve | Control Valve |
| DemoPlant | DemoArea | Unit1 | 011900P048 | 011900PT048 | Lean Meg to Well Fluid | PT | PrarpessureTransmitter02 | Pressure Transmitter | Pressure |
| DemoPlant | DemoArea | Unit2 | 011990F021 | 011900FT021 | 199-0-CL-001AB Liq Fltrs | FT | FlowTransmitter01 | Mass Flow Transmitter | Flow |
| DemoPlant | DemoArea | Unit2 | 011990F022 | 011900FT022 | 199-0-CL-001A/B to Em | FT | FlowTransmitter02 | Mass Flow Transmitter | Flow |
| DemoPlant | DemoArea | Unit2 | 011990F021 | 011900FV021 | 199-0-CL-001AB Liq Fltrs | CV | ControlValve03 | Control Valve | Control Valve |
| DemoPlant | DemoArea | Unit2 | 011990F022 | 011900FV022 | 199-0-CL-001AB Liq Fltrs | CV | ControlValve04 | Control Valve | Control Valve |
| DemoPlant | DemoArea | Unit2 | 011990L061 | 011900LV061 | 199-0-VA-001A Level Co | CV | ControlValve05 | Control Valve | Control Valve |
| DemoPlant | DemoArea | Unit2 | 011990L061 | 011900LT061 | 199-0-VA-001A LP Stm | LT | DpLevelTransmitter01 | Dp Level Transmitter | Level |

Instruments (Tag) Index

FIG. 25

```xml
<?xml version="1.0" encoding="ISO-8859-1"?>
- <Enterprise Name="ABC Refinery">
  - <Site Name="Plant01">
    - <Plant Name="Site01">
      - <PlantArea Name="Area101">
        - <Unit Name="ReactorUnit1">
          - <Equipment Name="ReactorVessel1">
            - <Equipment Name="Tank101">
                <Device Name="LevelIndicator101"></Device>
              </Equipment>
              <Device Name="Pump101"></Device>
              <Device Name="Value101"></Device>
              <Device Name="Value102"></Device>
            </Equipment>
          </Unit>
        </PlantArea>
      </Plant>
    </Site>
</Equipment>
```

Asset Hierarchy

FIG. 26

| Plant | Area | System | Location | Controller | Cabinet | Rail | MotherBoardPart | BaseplateConfiguration |
|---|---|---|---|---|---|---|---|---|
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |
| DemoPlant | DemoArea | DCS | DemoLocation | CP2801 | DCS_SYS_CAB1 | DCS_SYS_CAB1_Rail_B | 80110 | first |

Nest Loading Report

FIG. 27

| Plant | Area | Unit | Compressor | Compressortype | AlarmID |
|---|---|---|---|---|---|
| DemoPlant | DemoArea | Unit1 | Compressor1 | Air Compressor | AL_101 |
| DemoPlant | DemoArea | Unit1 | Compressor1 | Air Compressor | AL_102 |
| DemoPlant | DemoArea | Unit1 | Compressor1 | Air Compressor | AL_103 |
| DemoPlant | DemoArea | Unit1 | Compressor1 | Air Compressor | AL_104 |
| DemoPlant | DemoArea | Unit2 | Compressor2 | Saur Compressor | AL_105 |
| DemoPlant | DemoArea | Unit2 | Compressor2 | Saur Compressor | AL_106 |
| DemoPlant | DemoArea | Unit2 | Compressor2 | Saur Compressor | AL_107 |
| DemoPlant | DemoArea | Unit2 | Compressor2 | Saur Compressor | AL_108 |
| DemoPlant | DemoArea | Unit2 | Compressor2 | Saur Compressor | AL_109 |
| DemoPlant | DemoArea | Unit2 | Compressor2 | Saur Compressor | AL_110 |

Plant Asset Index

FIG. 28

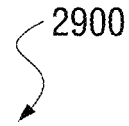

3SV0806 - Steam Turbine Condenser Spray Valve:

3SV0806, condenser spray valve or spray water curtain valve, is an open/close/auto solenoid valve. This cools the LP/RH bypass steam back into the turbine.

In Auto mode, the SV will auto open if any of the following valves come off their closed limit switch:

a. 1PCV0081 - U1 HRH Bypass vlv
 b. 2PCV0081 - U2 HRH Bypass vlv
 c. 1PCV0228 - U1 LP Bypass vlv
 d. 2PCV0228 - U2 LP Bypass vlv
 e. L33RFV_C - ST reverse flow valve

- and will close if all of the above are closed.

In Manual mode, the SV maybe commanded open or closed by the operator.

Ref. display = Condensate System, faceplate 3fv0806.

Process Control Narrative

FIG. 29

| Controller | Compound | Block | Application_IOM_ID | Application_FBM | Application_FBMType | Marshalling_IOM_ID | Marshalling_FBM | Marshalling_FBMType | Tag |
|---|---|---|---|---|---|---|---|---|---|
| CP2801 | CF101_011900 | PT038 | | | | 801101 | 801101 | FBM214b | 011900PV038 |
| CP2801 | CF101_011900 | PV038 | 801102 | FBM215 | | | 801102 | FBM215 | 011900PT038 |
| CP2801 | CF101_011900 | PT048 | 801101 | FBM214b | | | 801101 | FBM214b | 011900PV048 |
| CP2801 | CF101_011900 | PV048 | 801102 | FBM215 | | | 801102 | FBM215 | 011900PT048 |
| CP2801 | CF101_011900 | LV061 | 801102 | FBM215 | | | 801102 | FBM215 | 011900LV061 |
| CP2801 | CF101_011900 | LT061 | 801102 | FBM215 | | | 801102 | FBM215 | 011900LT061 |
| CP2801 | CF101_011900 | FV021 | 801102 | FBM215 | | | 801102 | FBM215 | 011900FV021 |
| CP2801 | CF101_011900 | FV022 | 801102 | FBM215 | | | 801102 | FBM215 | 011900FV022 |
| CP2801 | CF101_011900 | FV021 | 801102 | FBM215 | | | 801102 | FBM215 | 011900FT021 |
| CP2801 | CF101_011900 | FV022 | 801102 | FBM215 | | | 801102 | FBM215 | 011900FT022 |

Data Extracted to Tabular Format

FIG. 30

Data Source: InstrumentIndex_Demo

| Source | Source Alias | Target | Target Alias | Relationship | Source Attributes | Action |
|---|---|---|---|---|---|---|
| Plant | Plant | Area | Area | hasArea | | ⬚⬚ |
| Area | Area | Unit | Unit | hasUnit | | ⬚⬚ |
| Unit | Unit | Instrument | Instrument | hasInstrument | | ⬚⬚ |
| Instrument | Instrument | Tag | Tag | hasTag | | ⬚⬚ |
| Tag | Tag | | | | P&Id, Instrumenttypedescription, Instrumenttype | ⬚⬚ |

Save +

FIG. 31

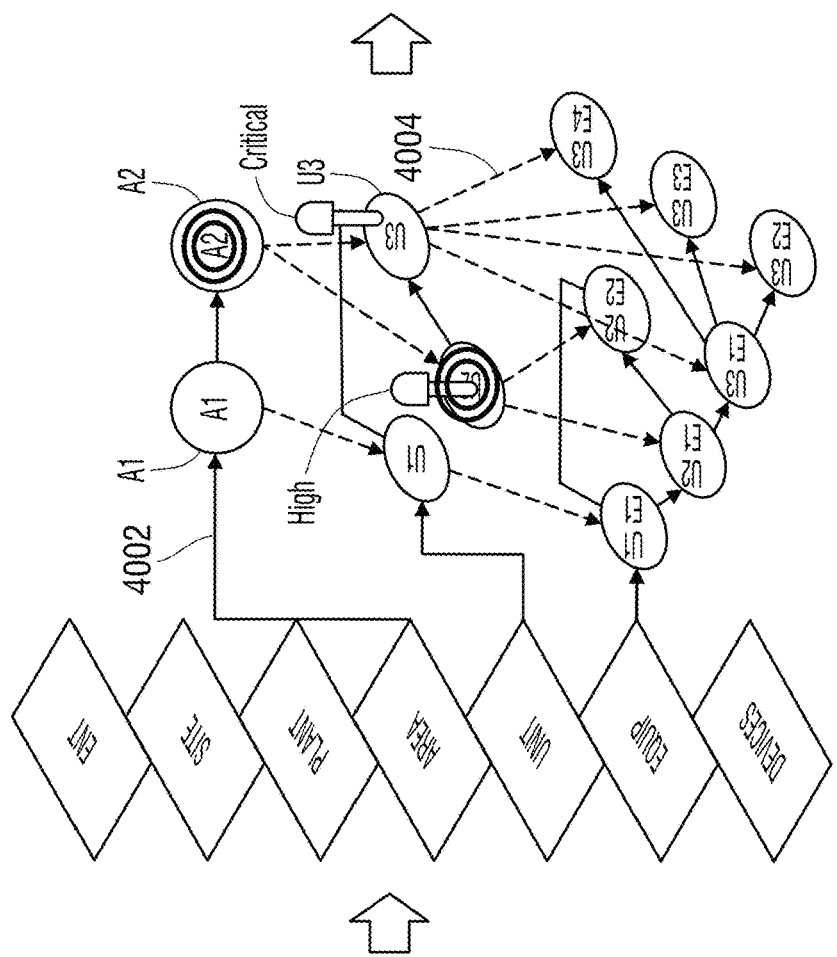
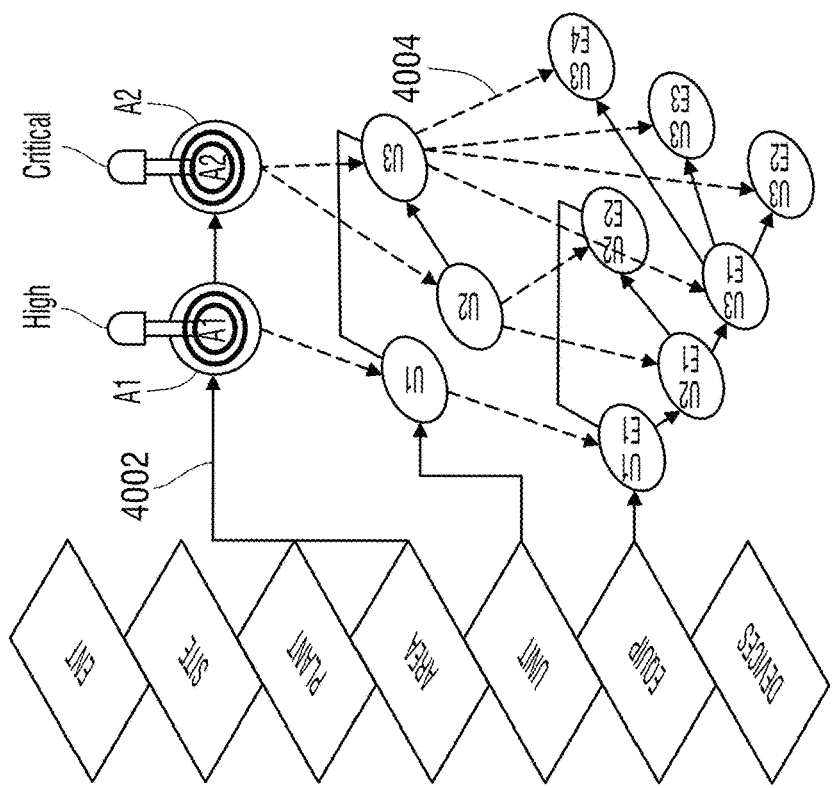
FIG. 40A

AUTOMATIC EXTRACTION OF ASSETS DATA FROM ENGINEERING DATA SOURCES FOR GENERATING AN HMI

CROSS-REFERENCE TO RELATED APPLICATIONS

This application for patent claims the benefit of priority to and incorporates herein by reference U.S. Provisional Application No. 62/823,469, entitled "Systems and Methods for Performing Industrial Plant Diagnostics and Operations," filed Mar. 25, 2019; U.S. Provisional Application No. 62/842,929, entitled "Systems and Methods for Performing Industrial Plant Diagnostics," filed May 3, 2019; and U.S. Provisional Application No. 62/823,377, entitled "Systems and Methods for Detecting and Predicting Faults in an Industrial Process Automation System," filed Mar. 25, 2019. This application is also related in subject matter to U.S. Non-Provisional application Ser. No. 16/021,867, entitled "Machine Learning Analysis of Piping and Instrumentation Diagrams," filed Jun. 28, 2018, which application is incorporated herein by reference.

TECHNICAL FIELD

Aspects of the present disclosure generally relate to industrial process automation and control systems. More particularly, aspects of the present disclosure relate to systems and method for extracting plant assets from engineering diagrams and other engineering data sources, creating a plant asset hierarchy from the plant assets, building an ontological knowledge base from the plant asset hierarchy and the asset association relationships with other assets, and providing a human-machine interface ("HMI") based on the plant asset hierarchy and the ontological knowledge base for controlling industrial process automation and control systems.

BACKGROUND

Plant operators are tasked with ensuring an industrial plant operates properly. This entails, for example, monitoring for and addressing alarms triggered by plant components (e.g., pumps, valves, tanks, sensors), performing operations on plant components (e.g., shutting down components and starting up components), and generally overseeing proper operation of the plant. To perform these tasks, plant operators may use an HMI that provides plant operators with a visual representation of plant components and data collected from plant components. The HMI may allow plant operators to interact with plant components (e.g., to perform an operation such as shutting down a component).

An HMI may be designed for a particular plant to capture the components within the plant, display data used to operate the plant, and provide an interface for initiating operations that may be desired by plant operators. Designing the HMI may be costly and time-consuming, and may require specialized knowledge of plant and process engineering. Today, plant HMIs are created using a process-centric approach that focuses on process definitions. A plant operator, on the other hand, has a more asset-centric view of the plant that focuses on automation control definitions (e.g., plant, area, unit, equipment, devices, set points of specific equipment, etc.). Thus, plant operators may find current plant HMIs to be non-intuitive and difficult to use.

Accordingly, improvements are needed in the field of industrial plant commissioning and operations.

SUMMARY

Embodiments of the present disclosure provide systems and methods for controlling industrial process automation and control systems. The methods and systems automatically, and through the use of machine learning (ML) models and algorithms, extract plant assets from engineering diagrams and other plant engineering data sources, establish asset relationships to create a plant asset registry and build an asset hierarchy from the plant assets, generate an ontological knowledge base from the plant asset hierarchy, and provide an HMI for controlling the industrial process based on the plant asset hierarchy and the ontological knowledge base.

In general, in one aspect, embodiments of the present disclosure relate to a control system for an industrial plant and corresponding method therefor. The control system (and method therefor) comprises, among other things, one or more processors and a storage unit communicatively coupled to the one or more processors. The storage unit stores processor-executable instructions that, when executed by the one or more processors, cause the control system to input an engineering diagram for a unit of the industrial plant, the engineering diagram including symbols representing assets of the industrial plant, and extract one or more assets from the engineering diagram using machine learning to recognize the one or more assets. The one or more assets include equipment, instruments, connectors, and lines, the lines relating the equipment, instruments, and connectors to one another. The processor-executable instructions also cause the control system determine one or more relationships between the equipment, instruments, connectors, and lines to one another using machine learning to recognize the one or more relationships. The processor-executable instructions also cause the control system to create a flow graph from the equipment, instruments, connectors, and lines and the relationships between the equipment, instruments, connectors, and lines.

In accordance with any one or more of the foregoing embodiments, the process that extracts one or more assets from the engineering diagram includes a geometry-based extraction process and a machine learning-based classification process. In accordance with any one or more of the foregoing embodiments, the processor-executable instructions further cause the control system to extract one or more control loops from the engineering diagram based on one or more of the equipment, instruments, connectors, and lines. In accordance with any one or more of the foregoing embodiments, the processor-executable instructions further cause the control system to extract a unit identifier from the engineering diagram, wherein the unit identifier uniquely identifies a particular unit from among multiple units in the industrial plant, and/or extract a drawing number and a revision number from the engineering diagram, the drawing number uniquely identifying the engineering diagram from among multiple engineering diagrams for the industrial plant and the revision number indicating a revision of the engineering diagram which is incremented whenever there are changes in the engineering diagram. In accordance with any one or more of the foregoing embodiments, the processor-executable instructions further cause the control system to assign a unique identifier to each equipment, instrument, connector, and line of the engineering diagram using the unit identifier from the engineering diagram. In accordance with any one or more of the foregoing embodiments, the process that determines one or more relationships between the equipment, instruments, connectors, and lines includes a process that generates a line-line graph, a process that generates an equipment-line graph, a process that generates a connector-line graph, and a process that generates an instrument-line graph. In accordance with any one or more of the foregoing embodiments, the processor-executable instructions further cause the control system to create the flow graph for the engineering diagram by performing a process that merges the line-line graph, the equipment-line graph, the connector-line graph, and the instrument-line graph with one another, and/or merge flow graphs from multiple engineering diagrams for the industrial plant to create a flow graph for the industrial plant. In accordance with any one or more of the foregoing embodiments, the processor-executable instructions further cause the control system to display the equipment, instruments, connectors and lines and the relationships between the equipment, instruments, connectors and lines in an asset hierarchy.

In general, in another aspect, embodiments of the present disclosure relate to a control system for an industrial plant and corresponding method therefor. The control system (and method therefor) comprises, among other things, one or more processors and a storage unit communicatively coupled to the one or more processors. The storage unit stores processor-executable instructions that, when executed by the one or more processors, cause the control system to input data from a plurality of engineering data sources for the industrial plant, the data including structured and unstructured data, and extract one or more domain entities from the structured and unstructured data. The processor-executable instructions also cause the control system to extract instances of the one or more domain entities from the structured and unstructured data, and receive a semantic model built based on the one or more domain entities and the instances of one or more domain entities. The processor-executable instructions further cause the control system to create and store a knowledge graph based on the semantic model, and extract information from the knowledge graph to build machine interface (HMI) displays and control applications for the industrial plant.

In accordance with any one or more of the foregoing embodiments, the processor-executable instructions further cause the control system to extract one or more assets of the industrial plant from the unstructured data using machine learning to recognize the one or more assets, and/or store the one or more assets of the industrial plant in an asset hierarchy using a namespace that uniquely identifies each asset. In accordance with any one or more of the foregoing embodiments, the processor-executable instructions further cause the control system to provide an asset registry application programming interface (API) for allowing users and external systems to access and use the asset registry. In accordance with any one or more of the foregoing embodiments, the processor-executable instructions further cause the control system to input data from the plurality of engineering data sources by inputting one or more of: alarm data, cabinet loading report, control database, cross wiring report, field wiring index, historical data, instrument index, asset hierarchy, nest loading report, plant asset index, process control narrative, and HMI specification. In accordance with any one or more of the foregoing embodiments, the processor-executable instructions further cause the control system to display the knowledge base as a plurality of interlinked labeled-property nodes, each node representing a domain entity, and/or display properties and relationships for each node when the node is selected by a user. In accordance with any one or more of the foregoing embodiments, the processor-executable instructions further cause the control system to allow a user to conduct a search of the knowledge base using natural language queries, display nodes responsive to the search along with assets that the nodes share in common, and/or display a legend for the nodes on a color-coded basis.

In general, in yet another aspect, embodiments of the present disclosure relate to a control system for an industrial plant and corresponding method therefor. The control system (and method therefor) comprises, among other things, one or more processors and a storage unit communicatively coupled to the one or more processors. The storage unit stores processor-executable instructions that, when executed by the one or more processors, cause the control system to input data from a plurality of engineering data sources for the industrial plant, and extract one or more assets of the industrial plant from the data using machine learning to identify the one or more assets. The processor-executable instructions also cause the control system to create an HMI (human-machine interface) asset model from the assets, the HMI asset model arranging the assets in a hierarchical structure, and generate an HMI display from the HMI asset model, the HMI display displaying symbols that represent the one or more assets of the industrial plant and lines that represent processes, connections, and data links between the assets. The processor-executable instructions also cause the control system to display the HMI display to a user and allows the user to navigate vertically and horizontally along the display, wherein the HMI display dynamically changes which assets are displayed based on a change in position of the user on the HMI display.

In accordance with any one or more of the foregoing embodiments, the processor-executable instructions further cause the control system to identify all alarms currently raised for the industrial plant and assets corresponding to the alarms and displays the alarms on the HMI display, and/or display the HMI display at a plant level, the plant level displaying all currently raised alarms identified for the industrial plant and assets corresponding to the alarms. In accordance with any one or more of the foregoing embodiments, the processor-executable instructions further cause the control system to determine and display on the HMI display assets that are potential root causes for an alarm upon the user selecting an asset corresponding to one of the alarms, wherein the control system determines the assets that are potential root causes by finding all assets that are connected to one another that also have an alarm, and/or allows a user to manually correct a root cause of an alarm on the HMI display, and provides the root cause from the user as feedback to the control system. In accordance with any one or more of the foregoing embodiments, the processor-executable instructions further cause the control system to automatically zoom in or zoom out on the assets displayed on the HMI display based on a change in a position of the user on the HMI screen. In accordance with any one or more of the foregoing embodiments, the processor-executable instructions further cause the control system to display assets in the HMI display as a two-dimensional view, wherein the HMI display allows a user to navigate vertically and horizontally within the two-dimensional view. In accordance with any one or more of the foregoing embodiments, the processor-executable instructions further cause the control system to dynamically change the assets displayed on HMI display based on an alarm occurring on an asset, and or display assets on the HMI display at runtime based on one of: static weight assigned to an asset based on a position of the asset in an asset hierarchy, and dynamic weight assigned to the asset based on an alarm being raised at the asset.

In general, in still another aspect, embodiments of the present disclosure relate to a computer-readable medium storing computer-readable instruction for causing one or more processors to perform a method according to any one more of the foregoing embodiments.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIGS. 15A-16B illustrate an PI&D flow graph according to embodiments of the disclosure;

FIGS. 16A-15B illustrate an exemplary line-line graph with devices removed according to embodiments of the disclosure;

FIG. 19 illustrates exemplary alarm data according to embodiments of the disclosure;

FIG. 20 illustrates an exemplary cabinet loading report according to embodiments of the disclosure;

FIG. 21 illustrates an exemplary control database according to embodiments of the disclosure;

FIG. 22 illustrates an exemplary cross wiring report according to embodiments of the disclosure;

FIG. 23 illustrates an exemplary field wiring index according to embodiments of the disclosure;

FIG. 24 illustrates exemplary historical data according to embodiments of the disclosure;

FIG. 25 illustrates an exemplary instrument index according to embodiments of the disclosure;

FIG. 26 illustrates an exemplary asset hierarchy according to embodiments of the disclosure;

FIG. 27 illustrates an exemplary nest loading report according to embodiments of the disclosure;

FIG. 28 illustrates an exemplary plant asset index according to embodiments of the disclosure;

FIG. 29 illustrates an exemplary process control narrative according to embodiments of the disclosure;

FIG. 30 illustrates an exemplary tabular format for data extraction according to embodiments of the disclosure;

FIG. 31 illustrates an exemplary user interface for building a semantic model using entity types according to embodiments of the disclosure;

FIGS. 40A-40B illustrate exemplary plant level alarm aggregation by an HMI according to embodiments of the disclosure.

Identical reference numerals have been used, where possible, to designate identical elements that are common to the figures. However, elements disclosed in one embodiment may be beneficially utilized on other embodiments without specific recitation.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Furthermore, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
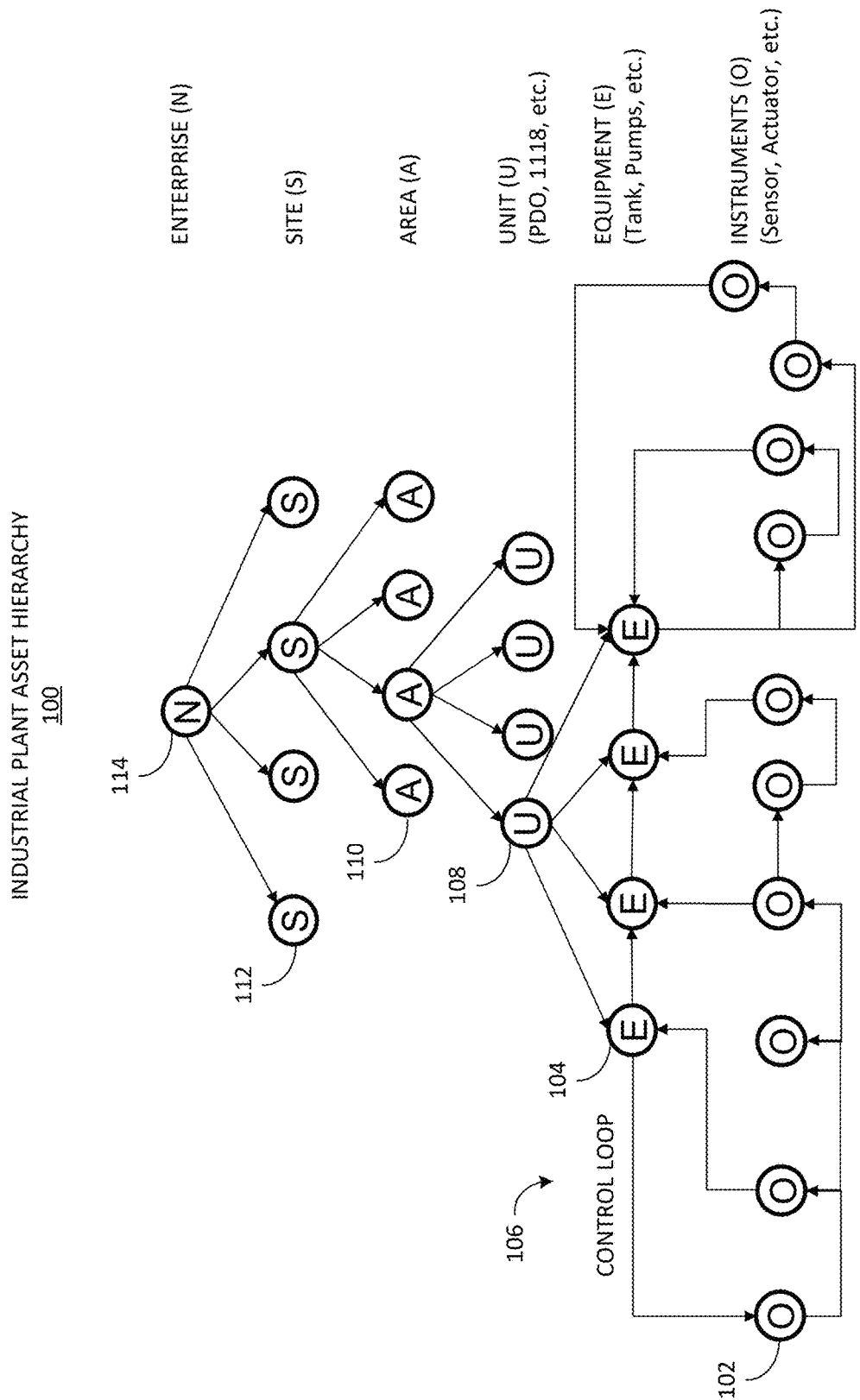
FIG. 1 illustrates an exemplary plant asset hierarchy according to embodiments of the present disclosure.

Referring now to FIG. 1, an example of an industrial plant asset hierarchy 100 is shown of the kind that may be created in accordance with embodiments of the present disclosure. The term "plant asset" as used herein generally refers to any plant equipment, instruments, groupings thereof, devices associated therewith, and the like, that are commonly employed in an industrial plant. At the bottom of the asset hierarchy 100 are instruments (O) 102, such as sensors, monitors, actuators, and the like. Immediately above the instruments 102 are equipment (D) 104, such as vessels, heaters, exchangers, pumps, motors, mixers, and the like. One or more instruments 102 may connect to one or more equipment 104 to form either a closed or an open control loop 106 that performs some subprocess in the plant process, such as mixing, heating, boiling, and the like. Several types of equipment 104 and instruments 102 may combine to form a unit (U) 108 that serves some function within the plant process, such as a gas synthesizer unit. Multiple such units 108 make up an area (A) 110, while multiple areas 110 make up a plant site (S) 112, and multiple sites 112 form an enterprise (N) 114.

Additionally, in general, while each node in the hierarchy 100 can have children and parent, each child can usually have only one parent. However, assets like pipes and wires can be treated as equipment so that a pipe carrying material from/to two assets can be logically split into two pipes. A device or instrument can only be connected to one equipment. Such a hierarchy 100 arranges and organizes plant assets in a way that is logical and much easier for plant control systems and plant operators to understand and use.

Figure 2:
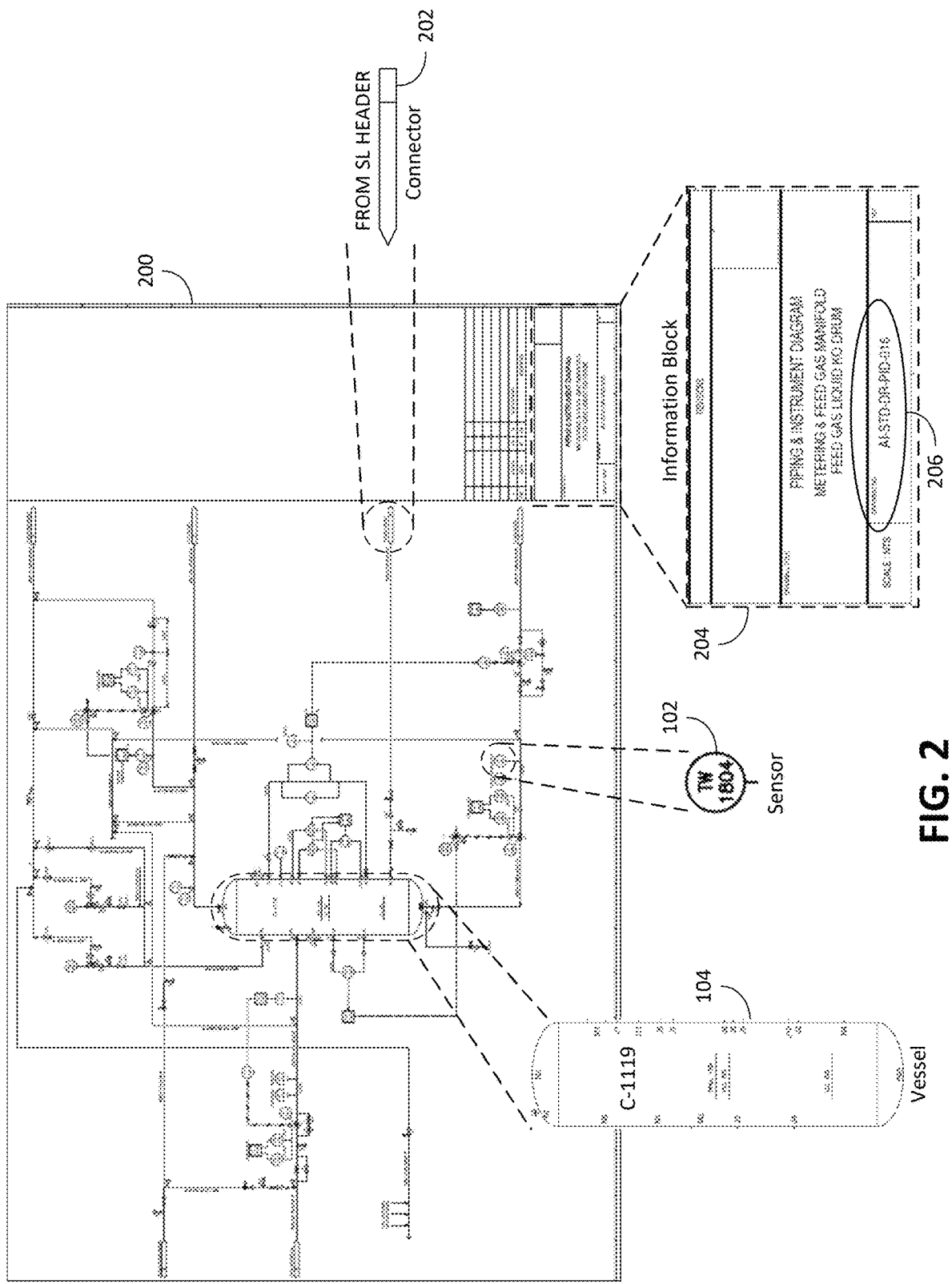
FIG. 2 illustrates an exemplary engineering diagram that may be used to build a plant asset hierarchy according to embodiments of the present disclosure.

FIG. 2 shows an exemplary engineering drawing or diagram 200 that may be used to build the asset hierarchy 100 (or portions thereof) according to embodiments of the present disclosure. The engineering diagram 200 may be any diagram, such as a process flow diagram (PFD) or a piping and instrumentation diagram (P&ID), that graphically depicts how various instruments 102 (e.g., sensor) and equipment 104 (e.g., vessels) in the plant are connected to one another. The exemplary diagram 200 in this example is a P&ID, each P&ID displaying a plurality of symbols that represent devices or instruments, equipment, and other components typically needed for implementing one unit 108. Connectors 202 located throughout the diagram 200 specify how individual PI&Ds (i.e., units) are connected together to form an area, site, and so forth. Each diagram 200 typically also has an information block 204, usually in the lower right-hand corner, that displays a drawing identifier 206, a unit identifier, and other information (e.g., revision number) that help uniquely identify the PI&D. Other well-known parts of the PI&D not expressly mentioned here include tag numbers, lines (e.g., process, electrical, data link, etc.), loops, and the like.

Figure 3:
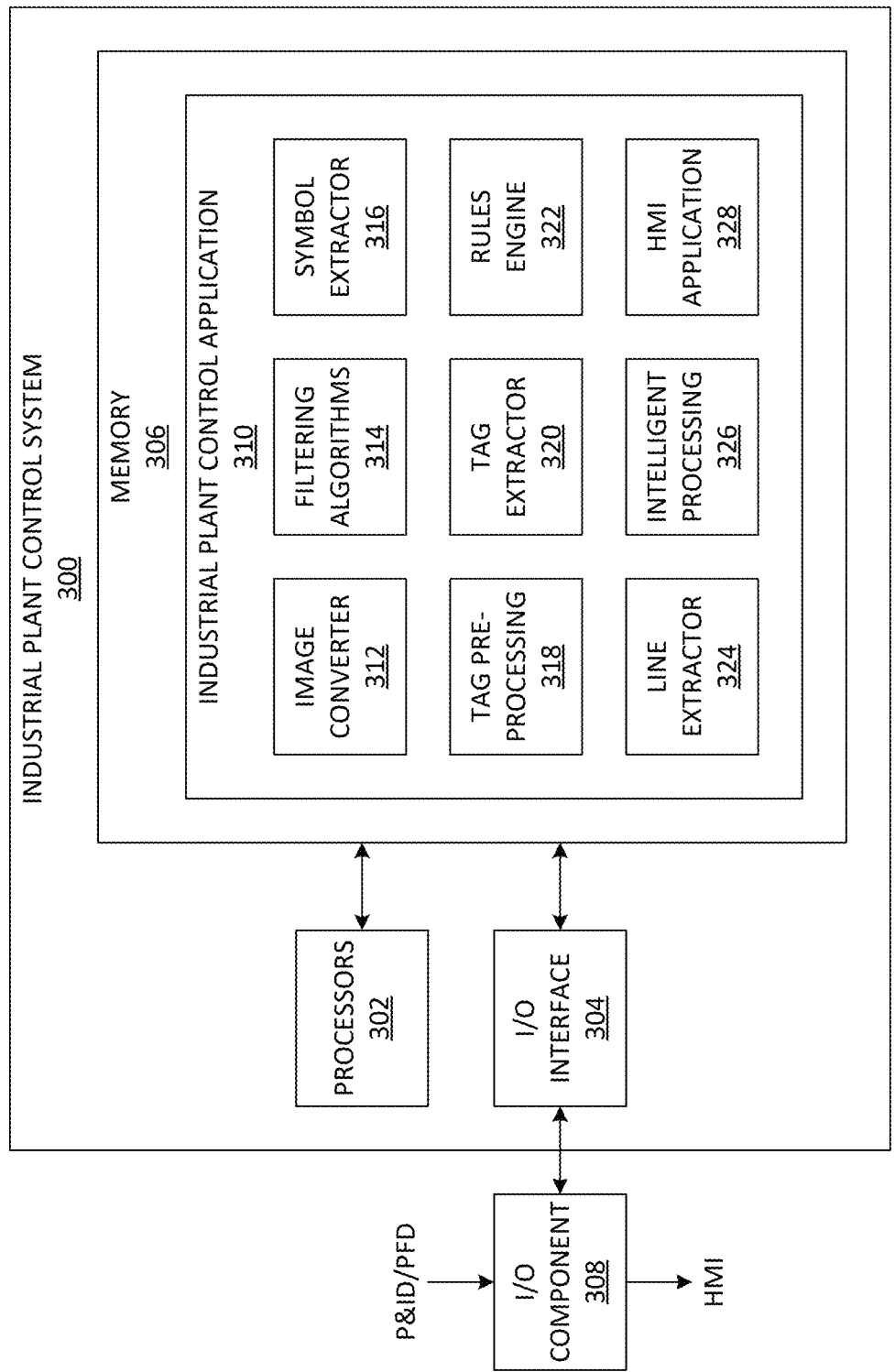
FIG. 3 illustrates an exemplary industrial plant control system that may be used to process according to embodiments of the present disclosure.

FIG. 3 illustrates an exemplary industrial plant control system 300 that can be used to process the engineering diagrams 200 and other plant engineering data sources according to embodiments of the present disclosure. As can be seen, the exemplary system 300 includes one or more processors 302, an internal input and/or output ("I/O") interface 304, and a memory 306, all communicatively coupled and/or electrically connected to each other. These components allow the system 300 to, among other things, extract various instruments 102, equipment 104, control loops 106, units 108, areas 110, and sites 112 from the engineering diagrams 200, lines (e.g., process, electrical, data link, etc.), establish relationships between the asset to build a plant asset hierarchy 100, generate an ontological knowledge base from the plant asset hierarchy 100, and provide an HMI for controlling the plant ontological knowledge base.

The system 300 may be communicatively coupled and/or electrically connected to an external I/O component 308. The external I/O component 308 allows the system 300 to interact and communicate with users and external systems. The communication may be accomplished over one or more communication networks (not expressly shown) connected to the I/O component 308. The communication networks may include a wide area network (WAN) and/or a local area network (LAN) that is connectable to other telecommunications networks, including other WANs, LANs, and/or portions of the Internet or an intranet. The communication networks may be any telecommunications network that facilitates the exchange of data, such as those that operate according to the IEEE 802.3 (e.g., Ethernet) and/or the IEEE 802.11 (e.g., Wi-Fi) protocols, for example. In another embodiment, the communication networks are any media that allow data to be physically transferred through serial or parallel communication channels (e.g., copper wire, optical fiber, computer bus, wireless communication channel, etc.).

Operation of the various components of the system 300 is generally well known in the art and thus is only briefly mentioned here. Processors 302 may be adapted to execute processor-executable instructions stored in the memory 306. The memory 306 may be adapted to provide processor-executable instructions to the processor 302 upon request. Included among the instructions stored on the memory 306 is an industrial plant control application 310. The industrial plant control application 310 may include a number of functional modules that work together to extract assets, establish asset relationships, build an asset hierarchy, generate a knowledge base, and provide an HMI, among other things. These functional modules may include, for example, an image converter 312, filtering algorithms 314, symbol extractor module 316, tag pre-processing algorithms 318, tag extractor module 320, rules engine 322, line extractor module 324, intelligent processing module 326, and an HMI application 328.

Image converter 312 is configured to convert diagrams 200 to an image format. In some embodiments, image converter 312 obtains diagrams 200 in a Portable Document File (PDF) or other electronic data format and converts the diagrams to another image format, such as Portable Network Graphics (PNG), Joint Photographic Experts Group (JPEG), Graphics Interchange Format (GIF), and the like. In some embodiments, image converter 312 creates two image files, one for display and one for computation (e.g., by filtering algorithms 314, symbol extraction 316, tag pre-processing 318, tag extractor 320, rules engine 322, line extractor 324, and intelligent processing 326).

Filtering algorithms 314 are configured to process the compute image to obtain an approximate size of the symbols therein. Exemplary symbols include, but are not limited to, those that conform to the International Society of Automation (ISA) standards for instruments, control/display elements, programmable logic controllers (PLCs), valves, pumps, and the like. In some embodiments, the symbols include identification letters (e.g., "FIC") and a tag number (e.g., "123"). Obtaining the approximate size of the symbols helps normalize the symbols for machine learning purposes (via intelligent processing 326), as discussed later herein (e.g., to avoid creating training data for different sizes of symbols).

Symbol extractor 316 is configured to detect the symbols extracted from the images. In some embodiments, symbol extractor 316 applies image processing algorithms to identify probable regions of symbols in the images, then detects the symbol types and locations in the images via a gross symbol identification technique. The symbol extractor 316 maintains a running count of newly detected symbols in order to keep track of the number of detected symbols and determine whether any new symbols were detected during a given execution cycle.

Tag pre-processing 318 is configured to remove symbol lines from detected symbols in the compute image, leaving only the tag components. In some embodiments, this involves centering the symbol, then removing the symbol lines from the symbols, leaving only the tag components. Connected pixels are clustered and anything less than a standard text size and greater than a standard text size is removed. Each cluster of pixels is assigned a bounding box that defines a boundary around the cluster for processing purposes. Tag pre-processing 210 then finds bounding boxes at the same level vertically and in order from left to right. This allows tag pre-processing 210 to remove non-tag pixels and noise.

Tag extractor 320 is configured to extract the tag component of a symbol in the compute image, such as a tag name and tag number. In some cases, neighboring characters in the tag name and/or tag number are joined with each other and should be separated. In these cases, tag extractor 320 checks for vertical gaps in the characters of the tag and segments the characters and thereafter performs character recognition using machine learning techniques (via intelligent processing 326). When no vertical gaps are present, tag extractor 320 determines whether a width-to-height ratio of the given character set is greater than a predetermined threshold value (e.g., 0.6, etc.). If the width-to-height ratio is greater than the predetermined threshold value, tag extractor 320 applies segmentation using pixel density in the vertical direction. Areas that show peaks of white pixels are potential areas of split in joined characters. Thereafter, tag extractor 320 performs character recognition using machine learning techniques.

Rules engine 322 is configured to verify extracted tags from the compute image based on one or more rules. In some embodiments, the rules are based on ISA symbol standards and are divided into two categories: major compliance checks (e.g., red category) and minor compliance checks (e.g., orange category). Exemplary major compliance checks include, but are not limited to, verifying that the symbol is one of the valid types (e.g., field device, control room display, etc.) and verifying that the tag name has one or more identification letters. Exemplary minor compliance checks include, but are not limited to, verifying that identification letters in a tag name do not contain any numerical digits and the tag number in a tag name does not contain any alphabet characters except at the end.

The line extractor 324 is configured to extract lines between symbols in the compute image. In some embodiments, the extracted lines comprise piping and connections symbols, such as, piping, process connections, electrical signals, pneumatic signals, data links, capillary tubing for filled systems, hydraulic signal lines, and guided electromagnetic or sonic signals. As will be understood by one of ordinary skill in the art, lines are extracted from the image using geometrical line fitting algorithms. Once lines are extracted, a portion of the line is subjected to one or more machine learning models (via intelligent processing 326) to obtain the type of the line as mentioned above. Additional details regarding operation of modules 312-324 may be found in U.S. Non-Provisional application Ser. No. 16/021, 867 mentioned above and incorporated herein by reference. Intelligent processing 326 and HMI application 328 are discussed further below.

Figure 4:
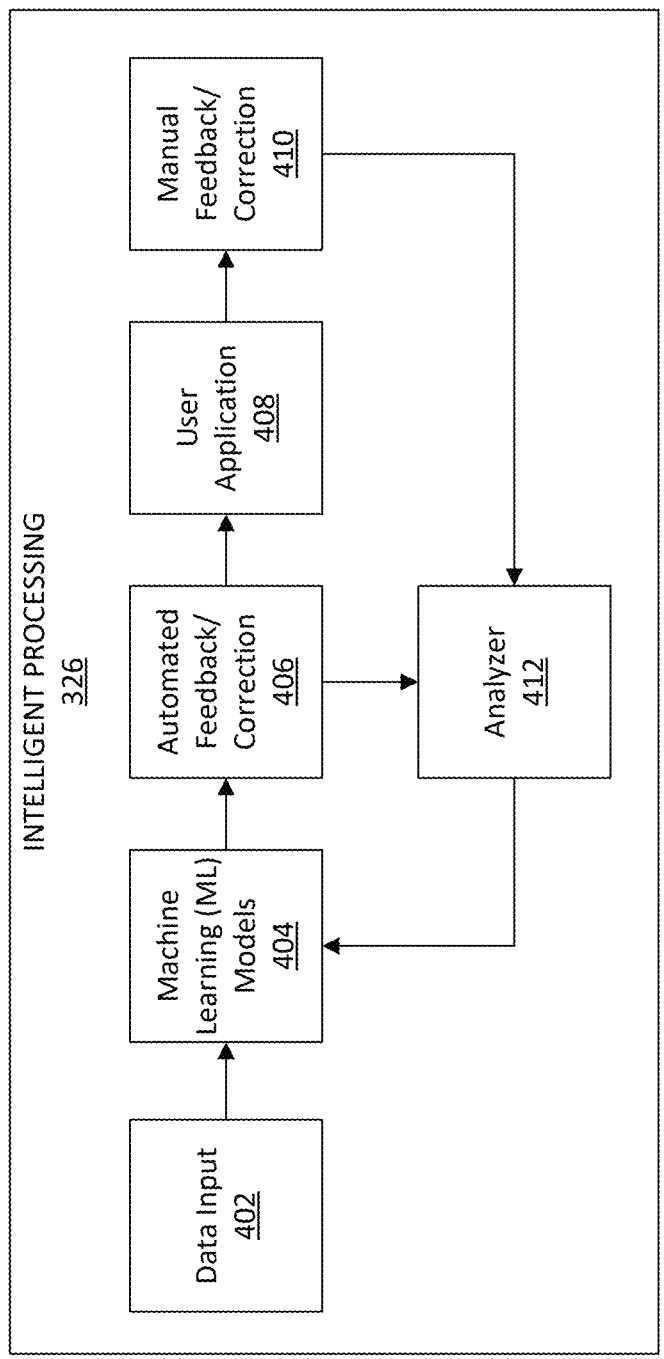
FIG. 4 illustrate an exemplary intelligent processing module that may be used with the industrial plant control system according to embodiments of the present disclosure.

FIG. 4 shows an exemplary implementation of intelligent processing 326 according to embodiments of the present disclosure. As discussed, this module 326 implements machine learning models and algorithms to identify symbols in the compute image. In some embodiments, intelligent processing 326 applies a deep neural network to specific areas of the image obtained through advancing a sliding window over the entire image. In the FIG. 4 example, intelligent processing 326 includes a data input component 402, one or more machine learning models 404, an automated feedback/correction component 406, a user application 408, a manual feedback/correction component 410, and an analyzer 412.

In general operation, the data input component 402 receives data representing diagrams (e.g., P&IDs, PFDs, etc.) and, after appropriate pre-processing, feeds the data to the one or more machine learning models 404. The machine learning models 404 use machine learning and image processing techniques to extract relevant information, such as names, numbers, symbols, lines, loops, and the like from the input data. The machine learning models 404 may also use image processing and/or geometrical algorithms to reduce noise and enhance accuracy. The automated feedback/correction component 406 applies rules and algorithms configured to detect errors in the output received from machine learning models 404. These errors are used to auto-correct the model output and fed back to the machine learning models 404 via the analyzer 412 to thereby update the learning of machine learning models 404. The processed output from automated feedback/correction component 406 is then displayed to a user for validation via the user application 408 (e.g., HMI application 328). The corrections made by the user are captured by the manual feedback/correction component 410 and fed back into the machine learning models 404 via the analyzer 412 to update the learning of machine learning models 404. In this manner, intelligent processing 326 can continuously evolve and improve evaluation of input data and extraction of relevant information therefrom.

As mentioned, intelligent processing 326 applies a deep neural network in some embodiments to specific areas of the image obtained. The deep neural network processing results in a multi-class classification of symbol candidates. In some embodiments, the symbols are classified per ISA symbology. Exemplary symbols include, but are not limited to, instruments, control/display elements, programmable logic controllers (PLCs), valves, pumps, and the like. In some embodiments, intelligent processing 326 utilizes at least three types of convolutional neural networks to recognize the various symbol candidates. The three types include a decider network to decide if the input is single or multiple characters, a single character network to recognize single alphabet and numeral characters, and a multi-character network to recognize multiple characters or words. In some embodiments, intelligent processing 326 also utilizes context-based prediction to differentiate between similar characters, such as the capital letter "I" from the number "1" and the number "0" from the letter "O" and the like.

Figure 5:
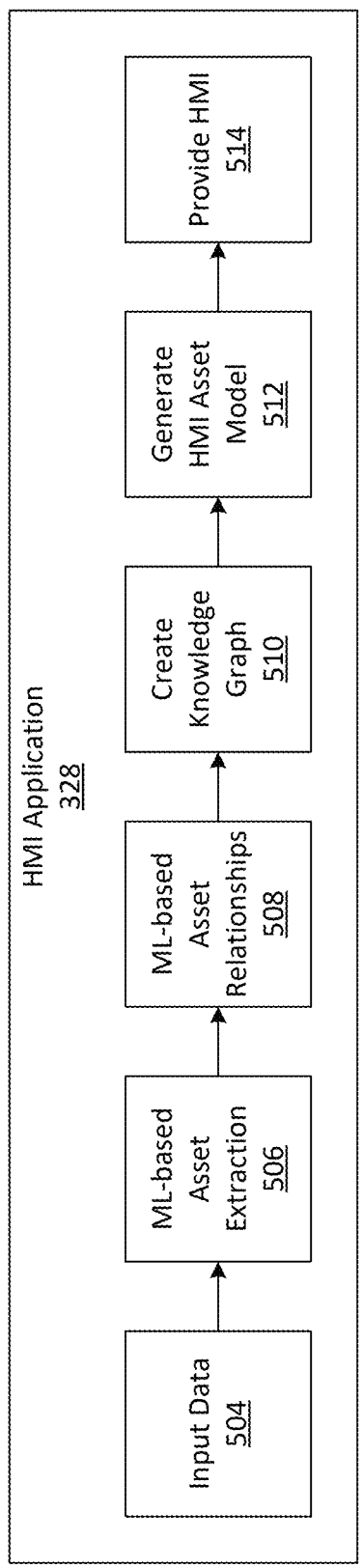
FIG. 5 illustrates an exemplary HMI application that may be used with the industrial plant control system according to embodiments of the present disclosure.

FIG. 5 an exemplary implementation of the HMI application 328 according to embodiments of the present disclosure. The HMI application 328 generally begins at block 504 with inputting data from various plant engineering data sources, including plant engineering diagrams (e.g., PI&D, PFD, etc.), into the industrial plant control system 300. At block 506, the data is processed to extract relevant information and assets, such as names, numbers, symbols, lines, loops, and the like from the data. The asset extraction is done using machine learning via intelligent process 316 and the ML models therein. Processing the data using the ML-based asset extraction described herein constitutes a practical application (e.g., the design of an HMI for an industrial plant using a specialized automated design system). Processing systems and methods described herein may improve the process of HMI design by permitting an image recognition model that identifies plant components in a diagram to run more efficiently and accurately. This can be achieved by inputting images that were predetermined by the pre-processing module as likely to lead to a positive identification by the image recognition ML model. This may also permit better training of the model, thus improving the accuracy of the model.

At block 508, extracted assets and other relevant information are used as input to an asset relationship establishing process to build an asset hierarchy, as described in more detail later herein. The asset relationship establishing is also done with the aid of intelligent process 316 and the ML models therein. Building an asset hierarchy using the ML-based asset relationship building process described herein is not well-understood, routine, or conventional in the field of HMI design. Building an asset hierarchy using the methods and systems described herein constitutes a practical application (e.g., the design of an HMI for an industrial plant using a specialized automated design system).

At block 510, the asset hierarchy may be used to create a knowledge graph based on a semantic model, as described in more detail later herein. Creating a knowledge graph using the methods and systems described herein is not well-understood, routine, or conventional in the field of HMI design. Creating a knowledge graph using the methods and systems described herein constitutes a practical application (e.g., the design of an HMI for an industrial plant using a specialized automated design system).

At block 512, the knowledge graph may be used to generate an HMI asset model (e.g., automatically using a computer), as described in more detail later herein. Generating a knowledge graph using the methods and systems described herein is not well-understood, routine, or conventional in the field of HMI design. Generating a knowledge graph using the methods and systems described herein constitutes a practical application (e.g., the design of an HMI for an industrial plant using a specialized automated design system).

At block 514, the HMI asset model may be used to provide or build an HMI (e.g., automatically using a computer), as described in more detail later herein. Generating the HMI using the methods and systems described herein is not well-understood, routine, or conventional in the field of HMI design. Providing an HMI using the methods and systems described herein constitutes a practical application (e.g., the design of an HMI for an industrial plant using a specialized automated design system).

Figure 6:
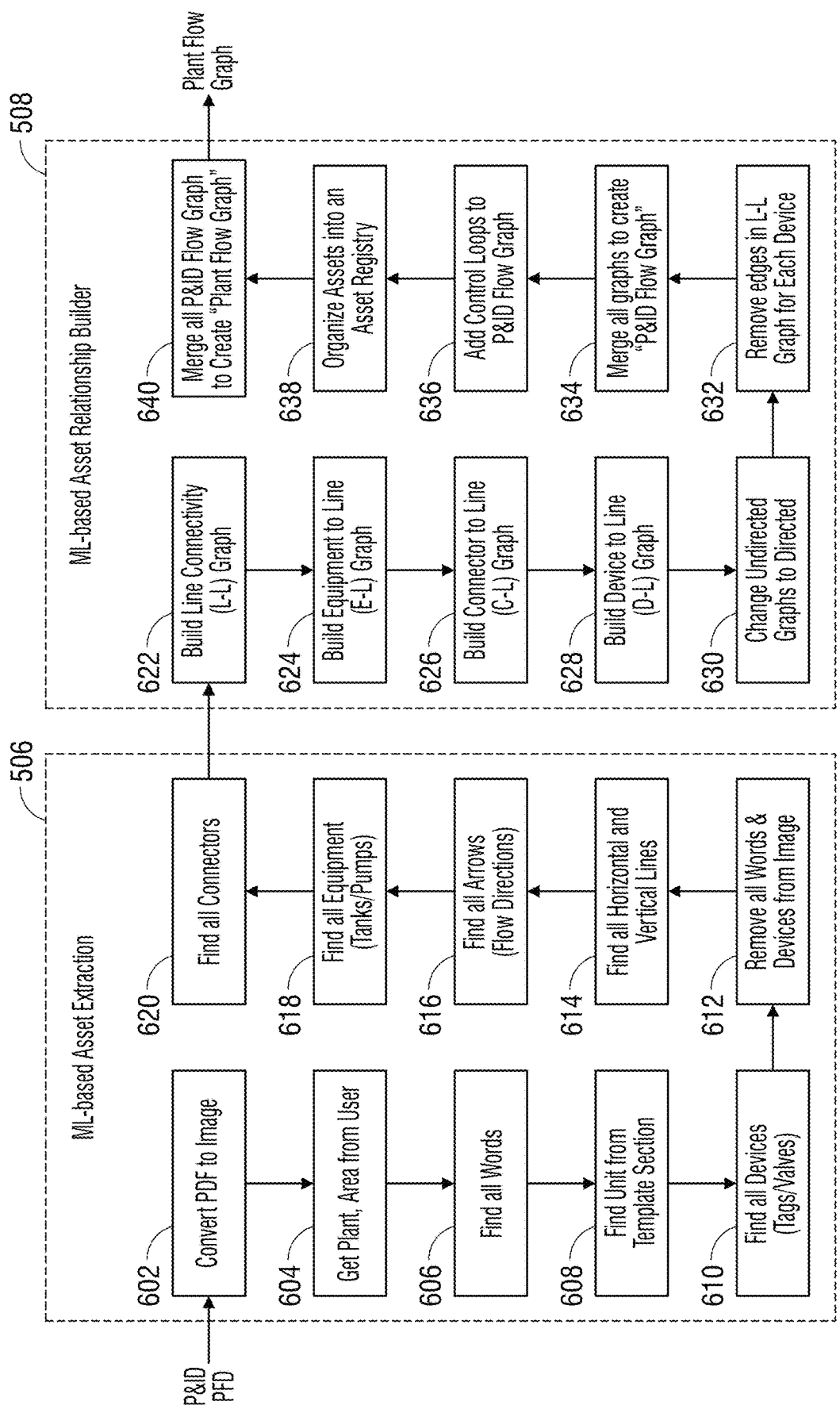
FIG. 6 illustrates exemplary ML-based asset extraction and relationship building according to embodiments of the present disclosure.

FIG. 6 shows the exemplary ML-based asset extraction process 506 and the ML-based asset relationship building process 508 from FIG. 5 in more detail.

ML-based asset extraction 506 generally begins at block 602 where engineering diagrams (e.g., PI&D, PFD, etc.) are converted from PDF to image format. At block 604, a user inputs information identifying a plant site and an area where each diagram is being used. At block 606, all text in the diagrams are found, and at block 608, unit identifiers for the diagrams are found.

In some embodiments, finding a unit identifier involves searching in the information block of a diagram or other predefined portion of the diagram for certain keywords, such as "Drawing" or "Unit" or "Section" or variations thereof. The predefined portion may be identified automatically based on analysis of previous diagrams (e.g., the rightmost area having a width that is 20% of the width of the P&IDs and PFDs, and the lowest area having a height that is 20% of the height of the P&IDs and PFDs), or the portion may be specified by the user. Upon finding the keyword (e.g., "Unit"), the system checks for text associated with the keyword, which may be in the same cell as the word "Unit" if there is a table, or to the right of the word, or below the word. Once the unit label has been determined, the determined label may be displayed to a user for validation. In some embodiments, this process may be performed for a relatively small number of diagrams (e.g., about 20). In this case, the positions of the determined labels may be used to determine subsequent labels in other diagrams without requiring or suggesting validation of the determination.

At block 610, all devices and instruments in a diagram (e.g., tags, valves, sensors, actuators, etc.) are found for each diagram, and at block 612, all found devices and instruments as well as text are removed or otherwise suppressed from the diagrams. This process may comprise generating a bounding box around diagram features that are to be removed and setting all internal pixels to the background color of the diagrams (e.g., white or black). The removal of text and devices makes it easier to find all the lines in the diagrams at block 614.

In some embodiments, the lines in the diagrams may be found by scaling down the diagrams and converting them to gray scale. Long horizontal and vertical lines may then be removed by detecting and deleting black pixels (in the case of a white background) that extend along the X and Y axes for longer than a predetermined length (e.g., 0.7 times the width and height, respectively, of the diagrams). Once this is done, the remaining horizontal and vertical lines may be found by searching for clusters of black pixels (in the case of a white background). A cluster is a group of pixels separated by less than a predetermined number of pixels (e.g., less than four pixels). Once found, the clusters may be connected to create horizontal and vertical lines by combining all the co-linear points of the cluster. Lines that are smaller than a predetermined length (e.g., 16 pixels) may be removed. In embodiments where the diagrams are scaled before lines are removed, the removed lines may be scaled back to their original size. This may permit the original line coordinates to be stored and referenced when determining the connections and relationships between plant components. Various line types may be identified, including piping and connections symbols, such as piping, process connections, electrical signals, pneumatic signals, data links, capillary tubing for filled systems, hydraulic signal lines, and guided electromagnetic or sonic signals. In some embodiments, the above line extraction can be done using geometrical line fitting algorithms.

Once the lines are extracted, a portion of the line is subjected to one or more machine learning models to obtain the type of the line as mentioned above. In some embodiments, a line extractor comprises processor-executable instructions embodied on a storage memory device to provide the line extractor via a software environment. For example, the line extractor may be provided as processor-executable instructions that comprise a procedure, a function, a routine, a method, and/or a subprogram.

Continuing at block 616, all arrows in a diagram may be found for each diagram. Such arrows indicate flow direction in the diagrams. An exemplary technique for identifying arrows in a diagram is described with respect to FIGS. 7A and 7B.

Figure 7A:
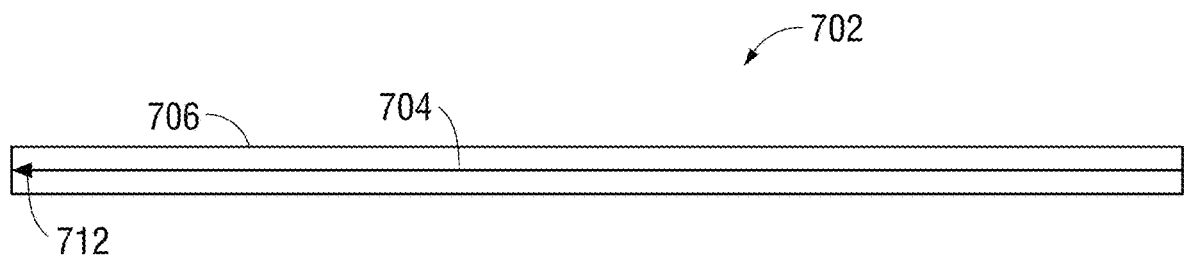
FIGS. 7A-7B illustrate an exemplary arrow extraction according to embodiments of the present disclosure.
Figure 7B:
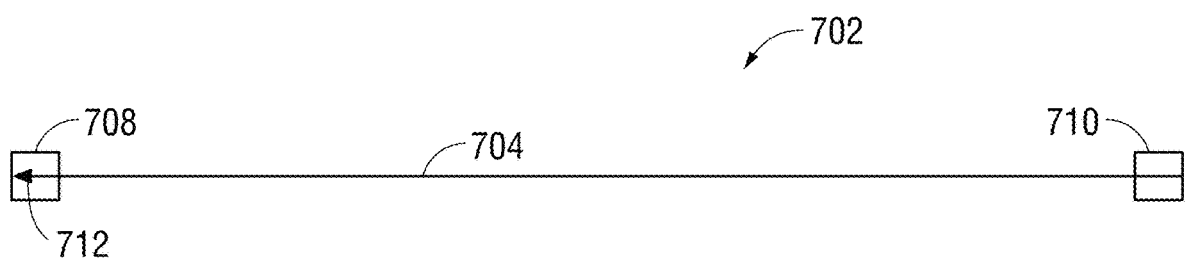

Referring to FIGS. 7A and 7B, an exemplary arrow 702 is shown. To analyze arrow 702, in some embodiments, a detected line 704 as shown in FIG. 7A is assigned a bounding box 706 that has, for example, a width perpendicular to the direction of the line that is a predetermined number of pixels wide (e.g., 40 pixels). To determine whether the line 704 is an arrow, two squares 708, 710 on each end of the line may be drawn with side lengths equal to the height of the generated bounding box 706. In some embodiments, the sides of squares 708, 710 may have different lengths. The contents of squares 708, 710 may be analyzed using a machine learning model or algorithm trained to determine the presence of an arrowhead 712 and the direction of the arrowhead. The ML algorithm may be, for example, a Convolutional Neural Network. The training data for the algorithm may be created by cropping head and tail portions of identified line segments by a specific size (e.g., 40×40 pixels). These cropped images may be stored and later classified as a left arrow, a right arrow, an up arrow, a down arrow, or no arrow. This classification may be done by, for example, a human. Identified line segments may be selected from diagrams received from different sources (e.g., different clients). In some embodiments, about 200 training images may be used for training. If both squares 708, 710 have an arrowhead, arrow 702 may be considered bidirectional. If only one of two squares 708, 710 has an arrowhead, arrow 702 may be considered unidirectional.

Referring back to FIG. 6, after arrows are identified, all equipment in a diagram (e.g., tanks, pumps, boilers, heat exchangers, etc.) are found for each diagram at block 618. The equipment is then assigned a name that helps uniquely identify the equipment. One of several naming conventions may be used depending on the particular industry. For example, the following naming convention may be used: <Type of Equipment>-<Name/ID of Equipment>, where hyphens or spaces act as delimiters. In the example of FIG. 2 above, the name assigned to the vessel may be "C-1119" where C is the type of equipment, and 1119 is the identifier for the equipment within the diagram. This name may then be persisted as the Regex (Regular Expression) for the tank for searching purposes. Similar naming conventions may be applied to other diagram components.

In some embodiments, finding the equipment combines a geometrical or geometry-based identification approach with machine learning or ML-based classifications.

Geometry-based identification of equipment is performed by first removing all instruments (e.g., by backgrounding the instruments) from the diagram to simplify the process, then finding all parallel lines that satisfy one or more criteria. Paths joining the parallel lines are then found and used to connect pairs of such parallel lines. A tank, for example, may be found by searching for parallel lines and connecting those pairs of lines that fulfill one or more criteria. A bounding box may then be defined around each pair that are thus connected. One criterion may require that two lines be within a predetermined distance of each other. In some embodiments, the predetermined distance may be between about 10% and 120% of the greater length of the two lines. The minimum length of such lines may be set at about 4% of the width of the diagram. The maximum length of such lines may be set at about 50% of the width of the diagram. The difference between the lengths of such two lines may be less than about 15% of the greater length of the two lines. The start and end points of the two lines (i.e., four points) may be used to make a box. The width and/or the height of the box may be expanded by a predetermined percent. For example, if the width-to-height ratio is less than about 0.3, the width may be expanded by about 80%. If the width-to-height ratio is between about 0.3 to about 0.4, the width may be expanded by about 60%. If the width-to-height ratio is more than about 0.4, the width may be expanded by about 40%. If the box is to be expanded beyond the figure boundary, the expansion may be stopped at the figure boundary. The resulting expanded box may be the bounding box. The image of the tank may be cropped at the bounding box. In some embodiments, the cropped image boundaries may be erased by making, for example, about 4 pixels of one or more sides white (in the case of a white background).

ML-based classification may then be used to identify the equipment type. For example, a machine learning model or algorithm may be used to analyze the resulting image for the presence of a tank and identify the tank type. The ML model or algorithm may be trained to detect and classify tanks.

In some embodiments, a resulting image may be analyzed to determine whether it is to be inputted into the model. For example, the image may be inputted into the model if it has a cluster comprising connected pixels (e.g., pixels with a maximum gap of about 2 pixels) having an expanded bounding box with a maximum dimension greater than the maximum dimension of the cluster's non-expanded bounding box and comprising the start and end points of the two parallel lines identified earlier in the tank-identification process. In some embodiments, the expanded bounding box may be generated by extending one or more lengths of the non-expanded bounding box based on the width-to-height ratio identified earlier in the process. The images inputted into the model may be, for example, 170×170 pixel black-and-white images. The model may be trained with a training data set of, for example, 1950 images. Instead or in addition, augmented training data may be used. For example, 46312 images may be used for training and 2518 for validation. Table 1 below shows exemplary training-data augmentation details as would be understood by those having ordinary skill in the art.

TABLE 1

Exemplary Training-Data Augmentation

| Augmentation Methods | Description | Offset-Value |
|---|---|---|
| Zero-offset | Project input original image to 64 × 64 pixel-size image | 0 |
| Horizontal and vertical offsets | Offset horizontal and vertically zero-offset image with specified values | Horizontal: 2, 4, 6, −2, −4, −6 Vertical: 2, 4, 6, −2, −4, −6 |
| Diagonal offset | Move zero offset diagonally | Diagonal values: (−2, −2), (−2, 2), (2, −2), (2, 2), (4, 4), (−4, −4), (−4, 4), (4, −4), (6, 6), (−6, −6), (−6, 6), (6, −6) |

Those skilled in the art will also understand that the above table, or a similar table, may be used to provide training-data augmentation for any of the other ML-based processes described herein.

Figure 8:
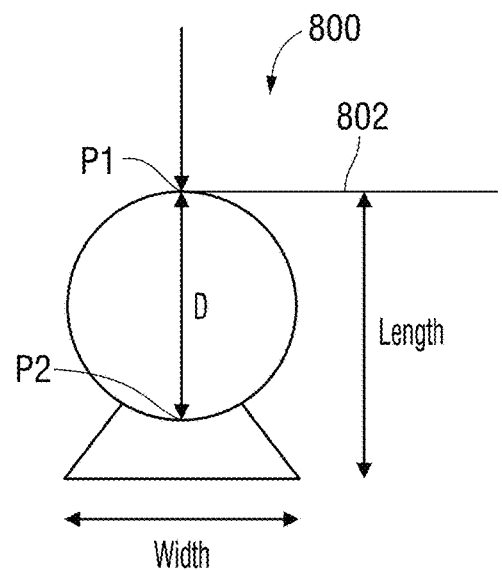
FIG. 8 illustrates an exemplary pump extraction according to embodiments of the present disclosure.

Referring now to FIG. 8, other equipment, such as pumps, may also be identified. Pumps may be identified by creating a bounding box containing the endpoint of one or more horizontal lines in a diagram. FIG. 8 shows an exemplary pump 800 around which a bounding box may be created. To create the bounding box, there may be traversal of pixels from an end point (e.g., P1) of horizontal line 802 in each direction perpendicular to line 802 until a black pixel (e.g., P2) is found. The distance (e.g., D) between P1 and P2 may be computed. If the distance is between predetermined values (e.g., 100 pixels and 200 pixels) then a bounding box may be created such that P1 and P2 are at the centers of the opposite sides of the bounding box. The width of the bounding box may be equal to the distance D. The bounding box may be expanded by 20% of the length towards point P2. The diagram may be cropped at the bounding box. Clusters of connected pixels may be generated from the cropped image by creating the groups of pixels with each group having all the pixels connected together horizontally, vertically or diagonally. For clusters with a length or width above a predetermined threshold (e.g., 150 pixels), the areas for the clusters may be determined. The cluster with the greatest area may have its bounding box determined by, for example, finding the minimum and maximum values of x and y coordinates in the cluster. The minimum values of x and y coordinates may determine the top left corner of the bounding box. The maximum values of x and y coordinates may determine the bottom right corner of the bounding box. The image may be cropped at this cluster's bounding box. The resulting image may be analyzed for the presence of a pump and its type using, for example, a machine-learning algorithm trained to detect and classify pumps. For example, a CNN architecture similar may be used.

Returning again to FIG. 6, at block 620, connectors in diagrams and their associated information may also be identified. Recall from above that connectors indicate connections between components located on different diagrams.

Figure 9:
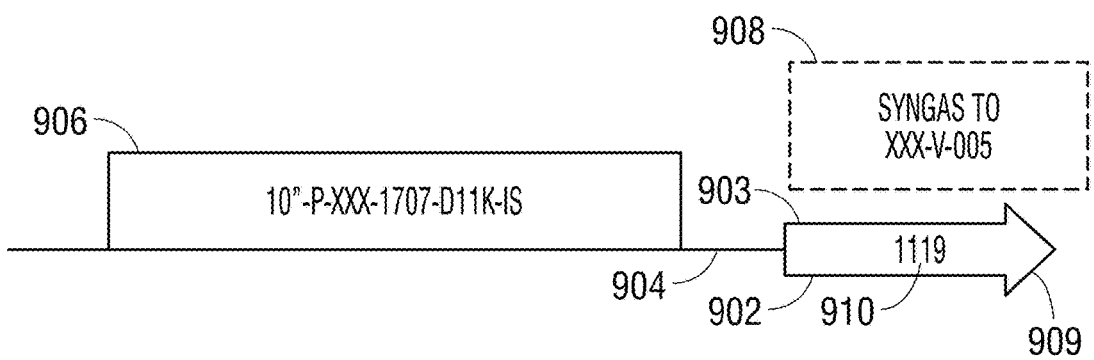
FIGS. 9 and 9A-9C illustrates an exemplary connector extraction according to embodiments of the present disclosure.
Figure 9A:
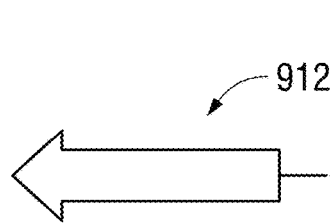
Figure 9B:
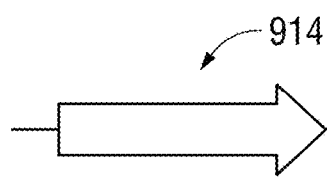
Figure 9C:
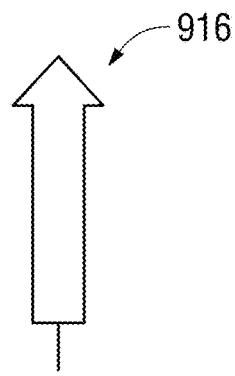

FIG. 9 illustrates an exemplary connector 902. As can be seen, rear end 903 of connector 902—the end without an arrowhead—has a line 904 connected to it, indicating that flow occurs from a component identified by a source identifier 906 over line 904 and to a component identified with a destination identifier 908 over connector 902. A connector with a line connected to its front end 909—the end with the arrowhead—may indicate that flow occurs from a component identified by a source identifier over the connector and to a component identified with a destination identifier over the line. A connector identifier 910 within connector 902 may indicate a diagram identifier (unit label) of the diagram containing the component identified with destination identifier 908. Similarly, the connector identifier 910 within the connector 902 may indicate the diagram identifier of the diagram containing the component identified with the associated source identifier. Connectors may be identified by filtering identified lines having a length between about 20 pixels to about 40 pixels. Pairs of lines with start points less than, for example, four pixels apart, end point less than, for example, four pixels apart, may be analyzed to determine whether they are part of a connector. If the length of one line in a pair is greater than the length of the other line in the pair, and the distance between the pair is more than about 0.1 and less than about 0.5 times the length of the longer line, the pair may be analyzed to determine whether they are part of a connector. A tight-fitting bounding box containing both lines may be created and each side expanded by half the distance between the two lines. Three resulting exemplary connector images are illustrated FIGS. 9A, 9B, and 9C respectively at 912, 914, and 916. The resulting images may be inputted into a machine-learning model trained to identify the presence and direction of a connector.

Note that the source identifier 906 may be highlighted or otherwise emphasized for easier viewing by the user. This technique may be applied throughout THE HMI to call the attention of the user to a particular feature.

To identify information associated with connector 902, a bounding box (not expressly shown) may be generated around text 910 inside connector 902 to determine if it is a connection identifier. If the bounding box is contained by the bounding box of connector 902, the text may be identified as connection identifier 910. Text situated above the bounding box of connector 902 within, for example, four times the distance between parallel lines of connector 902 (e.g., the two parallel lines connected to the arrowhead), may be identified as destination identifier contained in 908. In some embodiments, instead or in addition, text before and after the word "To" may be identified as a material name and destination identifier 908, respectively. In this context, the material name may identify the material flowing through a pipe or other material carrier. In some embodiments, instead or in addition, text before and after the word "From" may be identified as a material name and a source identifier, respectively. To identify the pipe identifier contained in 906, strides from the bounding box of connector 902 may be taken in the direction of line 904. In some embodiments, the strides may be two times the length of the bounding box of connector 902. When the shifted connector bounding box intersects with a bounding box of a word, the word may be identified as the pipe identifier contained in 906. If bounding boxes of multiple words are intersected, the word with the largest number of characters may be identified as the pipe identifier contained in 906. If connector 902 has a line connected to its front end, one or more of the preceding methods may be used to identify a source identifier and/or a destination identifier.

Returning once again to FIG. 6, after the ML-based asset extraction process 506 has concluded, the ML-based asset relationship building process 508 can begin for the extracted assets. This process of building relationships between extracted assets may comprise creating line connectivity graphs that capture the connections illustrated in the diagrams (e.g., PI&D, VFD, etc.), then merging the graphs to create a composite flow graph. The graphs that are merged may comprise graphs representing diagram lines connected to equipment, graphs representing diagram lines connected to connectors, and/or graphs representing diagram lines connected to instrument components (e.g., tags). Additionally, line connectivity, such as a line-line (line-to-line) graphs may also be generated to facilitate determining how various components are connected.

At block 622, a line-line (line-to-line) graph may be generated by detecting lines connected to a component's bounding box and checking such lines for co-linearity or perpendicularity. If co-linearity or perpendicularity is detected and the distance between the start or end point of one line and the start or end point of another line is less than a predetermined value (e.g. 32 pixels), the lines may be extended so that their ends meet. Lines that form part of a component (e.g., equipment) may be removed by removing those lines that have both endpoints lying within the component s bounding box. To assign indices to line segments and to keep track of line connections, lines may be split. Splitting a line into two segments is particularly useful if a device (e.g., tags, valves, etc.) is lying on top of the line. To do this, the distance to the start and end points of vertical lines may be measured from horizontal lines. In some embodiments, the start and end points of the horizontal lines may be excluded from this measurement. If the measured distance is less than a predetermined distance (e.g., 32 pixels), a split may be made in the horizontal line at the closest point between the horizontal line and the start or end point of the vertical line. This procedure may be repeated for vertical lines; if the distance from a vertical line to a start or end point of a horizontal line is less than a predetermined number (e.g., 32 pixels), a split may be made in the vertical line at the closest point between the vertical line and the start or end point of the horizontal line. In some embodiments, the distance from the vertical line to a start or end point of the horizontal line may exclude the start and end points of the vertical line. A line may be assigned an index number. When a line is split at a point, the two newly created segments may be assigned an index number. An adjacency matrix may be generated that represents line connections.

Figures 10A, 10B:
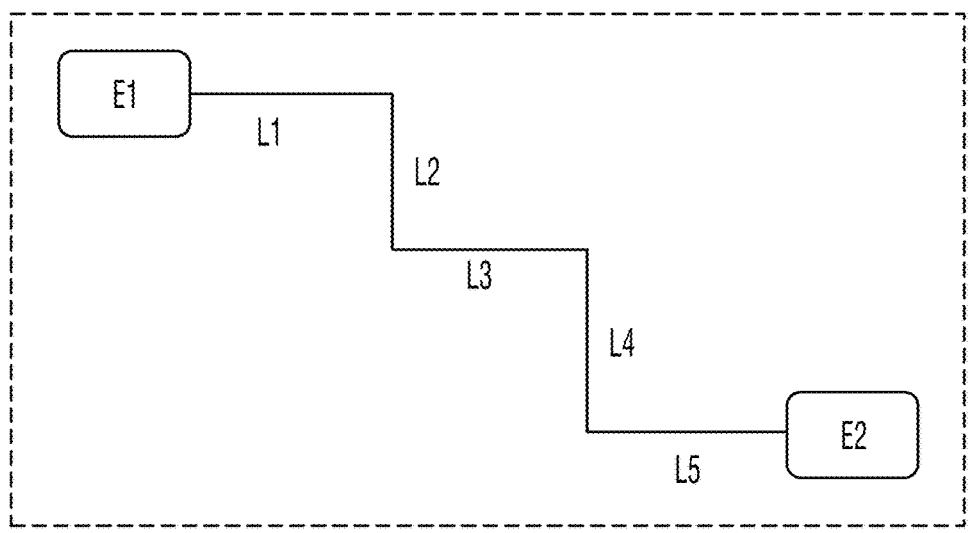
FIGS. 10A-10B illustrates an exemplary line-line graph according to embodiments of the disclosure.

FIG. 10A illustrates an exemplary adjacency matrix 1002. Adjacency matrix 1002 may have a size of n×n, where n is the total number of lines. The value at position [first line index, second line index] in adjacency matrix 1002 may be "0" to indicate that the lines with the first and second line index, respectively, are not connected to each other. The value at the position may be a "1" to indicate that these lines are connected. It is to be understood that other values may be used. Thus, adjacency matrix 1002 can indicate whether two lines are connected to each other. For example, going from left to right, node L2 has a "1" at node L1 and node L3 to indicate that L2 is connected to L1 and L3. To build the line-line graph, a node-edge (node-to-edge) graph may be generated where line indices are assigned a node and connected lines indices are assigned edges between nodes.

FIG. 10B illustrates an exemplary line-line graph 1004 corresponding to the adjacency matrix 1002. In the figure, nodes E1 and E2 represent two pieces of equipment and nodes L1, L2, L3, L4, and L5 represent line segments. As can be seen, line segments L1, L2, L3, L4, and L5 connect E1 and E2 together in the manner reflected by the adjacency matrix 1002.

Returning to FIG. 6, at block 624, graphs representing equipment-line (equipment-to-line) connections may be generated from the diagrams as part of the ML-based asset relationship building process 508. An example of building an equipment-line graph according to some embodiments is shown in FIGS. 11 and 12A-12B.

Figure 11:
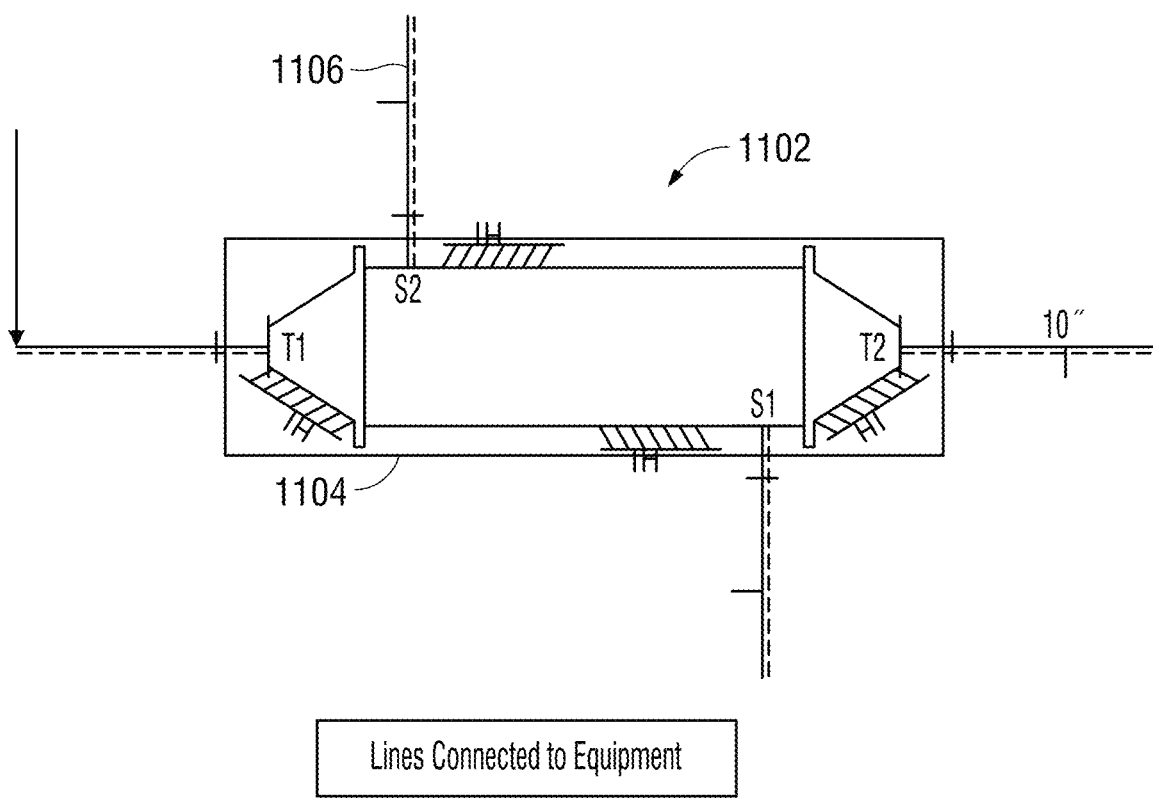
FIG. 11 illustrates an exemplary equipment extraction according to embodiments of the present disclosure.

FIG. 11 shows an exemplary piece of equipment 1102. As can be seen, a bounding box 1104 has been placed around the equipment 1102 for computing purposes. To build an equipment-line graph, the bounding box is expanded on each side by increasing the length of each side, for example, by 2.5%. Lines 1106 with end points lying in the expanded bounding box are then found and an associated node (e.g., L1, L2, L3, etc.) is generated for each line. In some embodiments, if two such lines are connected with each other, the line with an end point closer to the center of the bounding box may have an associated node generated. The equipment 1102 may also have an associated node (e.g., E1, E2, E3, etc.) generated. Thereafter, equipment-line pairs may have associated edges (e.g., (E1, L1), (E2, L2), (E3, L3), etc.) generated.

Figures 12A, 12B:
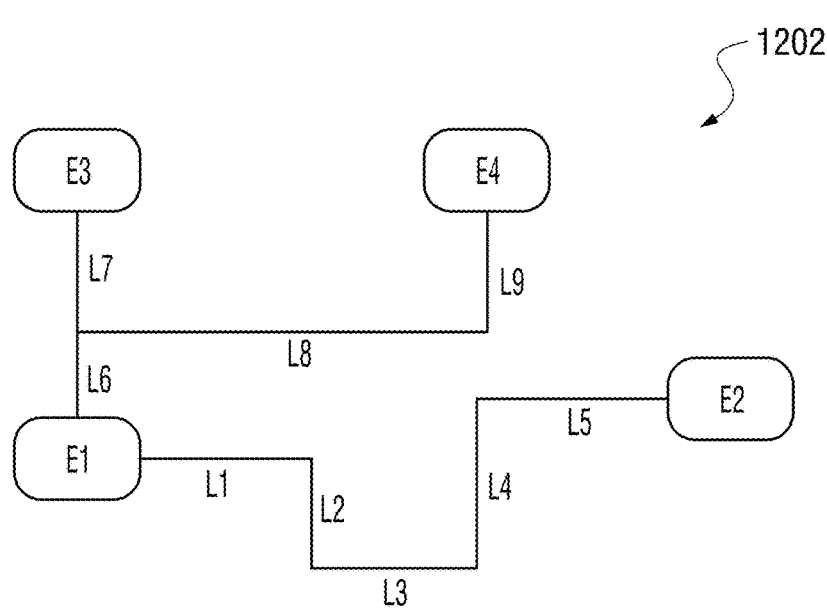
FIGS. 12A-12B illustrate an exemplary equipment-line graph according to embodiments of the disclosure.

FIG. 12A illustrates exemplary tables showing equipment-line connections. The figure shows an equipment-line table 1202 listing the various nodes (e.g., L1, L2, L3, etc.) and (e.g., E1, E2, E3, etc.) associated with the equipment 1102 and the line segments 1106, and an edges table 1204 listing the edges (e.g., (E1, L1), (E2, L2), (E3, L3), etc.) associated with those nodes.

FIG. 12B illustrates an exemplary equipment-line graph 1206 corresponding to the equipment-line table 1202 and edges table 1204. As can be seen, there are five edges, Edges 1, 2, 3, 4, and 5, reflecting the five points where lines L1, L5, L6, L7, and L9 are connected to equipment E1, E2, E3, and E4.

To find a path between two pieces of equipment, lines connected to the pieces of equipment may be identified by merging the graph 1206 representing diagram lines connected to equipment with adjacency matrix 1002. If multiple paths are found between the two equipment, then the shortest-path algorithm (e.g., Dijkstra's shortest-path algorithm) may be used on the graph to identify the path between the two pieces of equipment. The arrow direction associated with the path's lines may indicate the direction of material flow between equipment and designate which equipment is the destination and which is the source.

Returning once more to FIG. 6, at block 626, graphs representing connector-line (connector-to-line) connections may be generated from the diagrams as part of the ML-based asset relationship building process 508. Following is an example of building a connector-line graph according to embodiments of the present disclosure.

To build a connector-line graph, a bounding box is placed around a connector as discussed with respect to FIG. 9. The bounding box may then have its long sides expanded, for example, by 0.1 times the length thereof. The expansion may be in the direction of the arrow if the connector is an incoming connector, and in the opposite direction if the connector is an outgoing connector. A line with an end point lying within the expanded bounding box may then be identified. A node may then be generated for the connector, such as C1, and a node may also be generated for the line connected to the connector, such as Lc1. A directed edge may be then generated for the connector-lines pair, such as (C1, Lc1), with the edge direction determined by whether the line is connected to the connector's head or tail. To determine whether equipment is connected to a connector, a shortest-path algorithm (e.g., Dijkstra's shortest-path algorithm) may be used on the graph to determine a path between a line connected to the equipment and a line connected to a connector. If a connection is determined, the direction of the edge connected to the connector node can be used to determine the direction of the flow between the equipment and the connector.

Figures 13A, 13B:
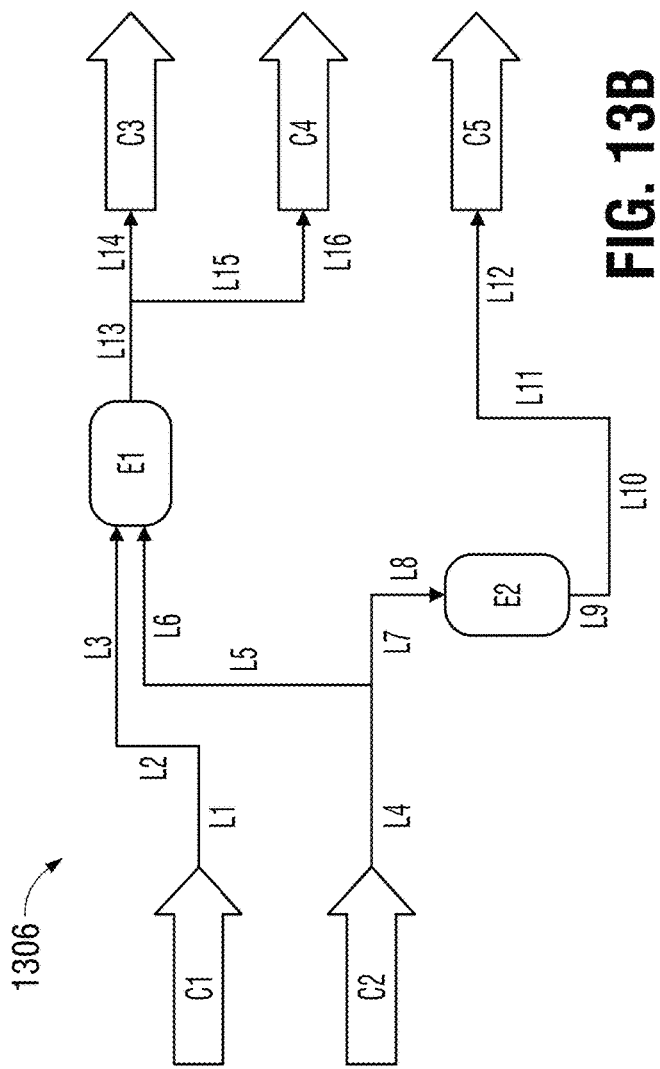
FIGS. 13A-13B illustrate an exemplary connector-line graph according to embodiments of the disclosure.

FIG. 13A illustrates exemplary tables showing connector-line connections. The figure shows a connector-line table 1302 listing the various nodes (e.g., C1, C2, Lc1, Lc2, etc.) associated with the connectors and line segments, as well as an edges table 1304 listing the edges (e.g., (C1, Lc1), (C2, Lc2), etc.) associated with those nodes.

FIG. 13B illustrates an exemplary connector-line graph 1306 that corresponds to the connector-line table 1302 and edges table 1304. As can be seen, there are five connectors, C1, C2, C3, C4, and C-5 connected to two pieces of equipment, E1 and E2, by line segments where lines L1-L16. Table 1308 shows the paths that are generated using the graph 1306.

Returning once more to FIG. 6, at block 628, graphs representing device or instrument-line (device/instrument-to-line) connections may be generated from the diagrams as part of the ML-based asset relationship building process

508. Following is an example of building a device/instruments-line graph according to embodiments of the present disclosure.

A graph representing lines connected to devices or instrument (e.g., tags, sensors, etc.) may be generated by providing bounding box around the device. Then, lines with end points lying within the bounding box may be identified. If less than two lines are found per bounding box, one or more sides of the bounding boxes can have their lengths increased, for example, by 50%. A node may then be generated for the device, such as D1, and node may also be generated for the line connected to the device, such as L1. Pairs of instruments and lines connected thereto may have associated edges generated. To determine whether an instrument and piece of equipment are connected, a shortest-path algorithm (e.g., Dijkstra's shortest-path algorithm) may be used on the graph to determine a path between a line connected to the instrument and a line connected to the equipment.

Figures 14A, 14B:
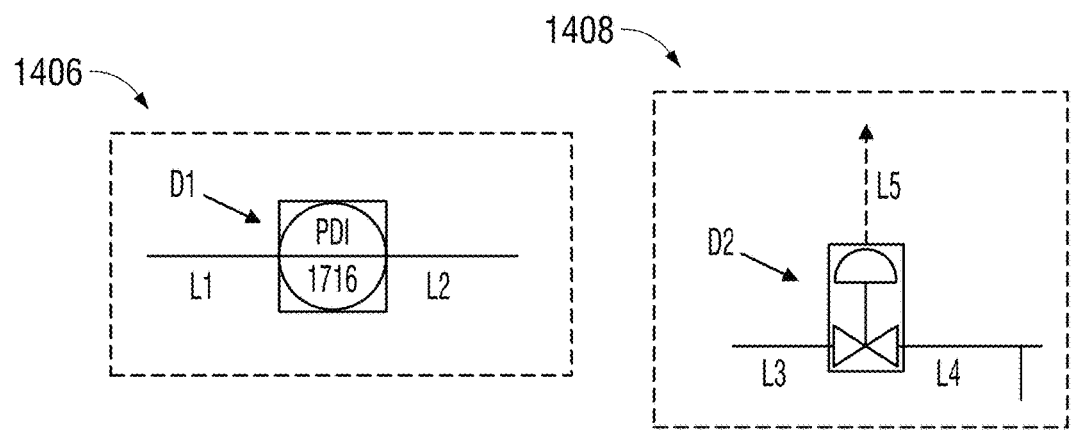
FIGS. 14A-14B illustrate an exemplary instrument-line graph according to embodiments of the disclosure.

FIG. 14A illustrates exemplary tables showing device/instruments-line connections. The figure shows a device/instruments-line table 1402 listing the various nodes (e.g., D1, D2, L1, L2, L3, L4, L5 etc.) associated with the devices and line segments, as well as an edges table 1404 listing the edges (e.g., (D1, L1), (D1, L2), (D2, L3), D2, L4), (D2, L5), etc.) associated with those nodes.

FIG. 14B illustrates an exemplary device/instruments-line graphs 1406 and 1408 that correspond to the connector-line table 1402 and edges table 1404. As can be seen in graph 1406, device D1 has two line segments, L1 and L2, connected thereto. In graph 1408, device D2 has three line segments, L3, L4, and L5, connected thereto.

Returning once again to FIG. 6, thus far, only directed graphs, or graphs that have a particular flow direction, have been discussed. In addition to directed graphs, there may also be undirected graphs in the diagrams. Any such undirected graphs may be changed to directed graphs at block 630 as part of the ML-based asset relationship building process 508. Following is an example of changing an undirected graph to a directed graph according to embodiments of the present disclosure.

To assign directions to a graph, such as a line-line graph, equipment-line graph, and device-line graph, all line nodes in an equipment-line graph are identified. For each of these lines, all possible paths in the line-line graph are traversed up to the lines that are connected to a connector or another piece of equipment. The paths may then be split into segments, and the lines in these segments may be assigned a direction. This may be done based on the direction of a connected connector, the presence of an arrow, or the direction of lines in an adjacent path (e.g., lines connected to a connector). For example, if one path is A→B→C→D and another path is A→B→E, then split these to paths into three paths: A→B, B→C→D and B→E. Bath directions may then be assigned as follows. If one of the lines in a path is connected to a connector, then assigned the direction of the connector (incoming or outgoing) to all lines in the path. If at least one of the lines in the path has an arrow, then assigned the direction of the arrow to all the lines in that path. If none of the lines in a path has an arrow and the path is not connected to a connector, then check for an adjacent path that is connected to a connector and assign the direction of the adjacent path to all lines in the path.

Returning once again to FIG. 6, recall from block 612 that all devices and instruments (as well as text) were removed from the diagram, resulting in the line-line graphs showing only connections from equipment to equipment and equipment to connectors. The line-line graphs may now be updated to include those devices and instruments at block 632 as part of the ML-based asset relationship building process 508. This may be done, for example, by restoring the devices to the point from where they were removed.

Figure 15A:
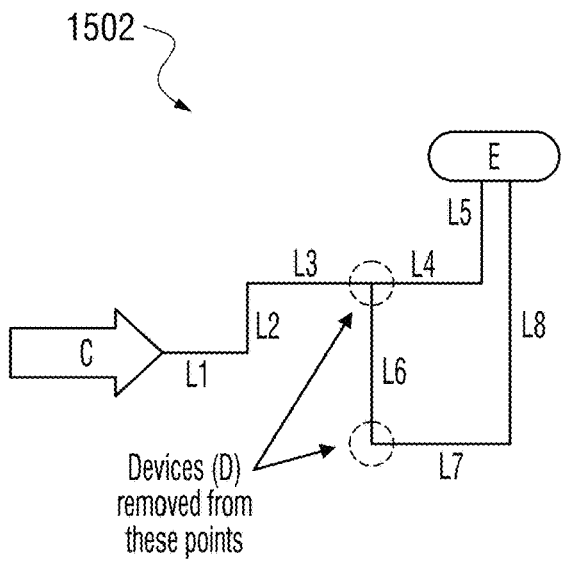

FIG. 15A illustrates an exemplary line-line graph 1502 and edge data table 1504 with the devices removed according to block 612 of FIG. 6. As can be seen, devices were removed from the points between the connector (C) and the equipment (E) where two dashed circles now sit and replaced with two corresponding edges, Edge 5 (L3, L6) an Edge 6 (L6, L7).

Figure 15B:
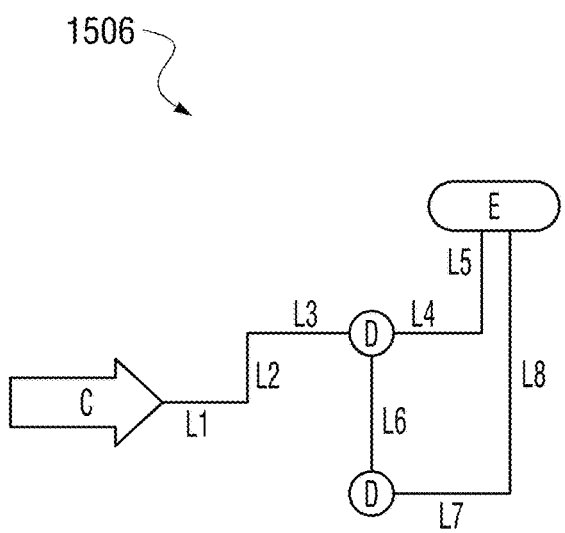

FIG. 15B illustrates the same exemplary line-line graph 1502 and edge data table 1504 after updating to restore the devices. As can be seen, two devices (D) are now positioned between the connector (C) and the equipment (E), replacing the two edges (L3, L6) and (L6, L7). This allows line connectivity graphs to reflect not only equipment-to-equipment and connector-to-equipment connections, but also device-to-equipment, device-to-connector, and device-to-device connections.

Returning once more to FIG. 6, at block 634, for a given diagram (e.g., PI&D, PFD, etc.), the various line connectivity graphs generated for that diagram may be merged as part of the ML-based asset relationship building process 508. For example, if the diagram is a PI&D, then all line connectivity graphs may be merged to create a PI&D flow graph.

Figures 16A, 16B:
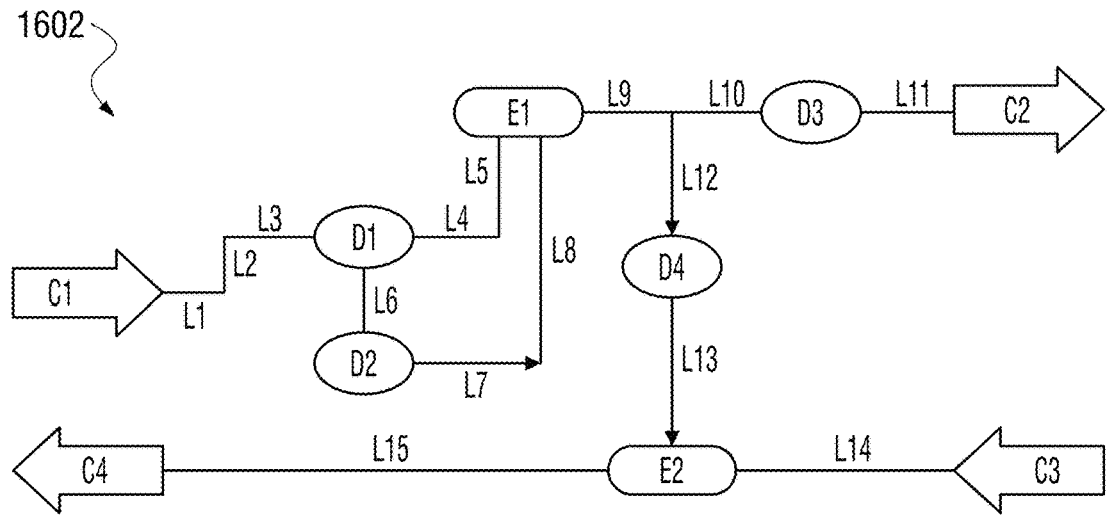

FIG. 16A illustrates an exemplary PI&D flow graph 1602 resulting from a merger of the various line connectivity graphs generated for a given PI&D by the ML-based asset relationship building process 508. This PI&D flow graph 1602, unlike its constituent graphs, contains all the connectors, devices or instruments, and equipment in the PI&D along with the connections there between. The PI&D flow graph 1602 thus captures the relationship between all the assets that were extracted from the given PI&D.

FIG. 16B illustrates an exemplary table 1604 containing the data for the merged PI&D flow graph 1602. The table 1604 includes the nodes and edges for each of the line connectivity graphs (e.g., line-line, equipment-line, connector-line, device-line, etc.) that were generated by the ML-based asset relationship building process 508 for the given PI&D. The table 1604 also contains the nodes and edges of the merged PI&D flow graph 1602. Such a table may then be used as part of generating the HMI.

Returning once again to FIG. 6, at block 636, control loops for a given diagram (e.g., PI&D, PFD, etc.) may be added to the merged PI&D flow graph 1602 as part of the ML-based asset relationship building process 508. As mentioned earlier, a control loop performs some sub-process in the plant process and may be either a closed or an open control loop. Most control loops involve several devices working together, including sensors, actuators, controllers, and the like. There are generally two types of control loops: simple control loops, and complex control loops. Simple control loops have an input, an output, and a controller, while complex control loops are made of several simple control loops. An example of identifying a control loop according to embodiments of the present disclosure is depicted in FIG. 17.

Figure 17:
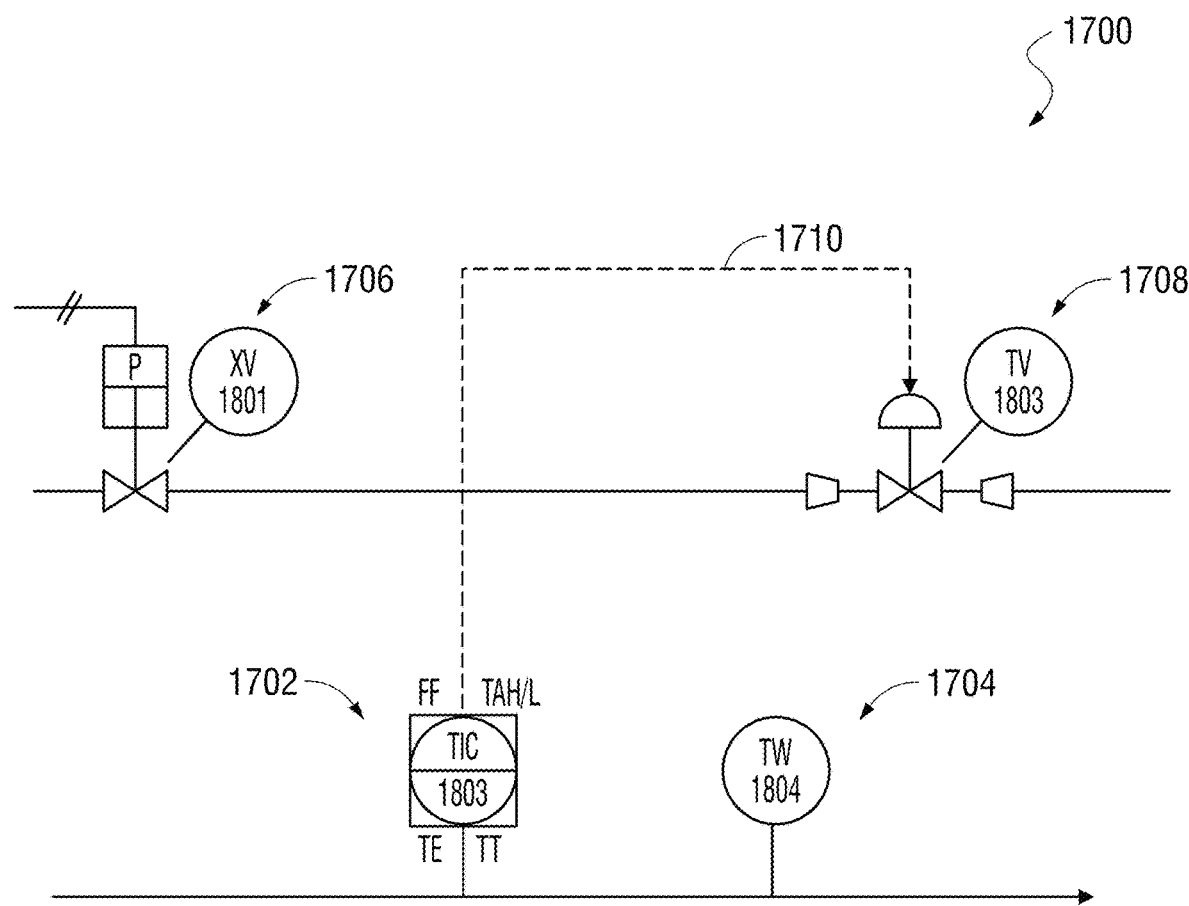
FIG. 17 illustrates an exemplary control loop according to embodiments of the disclosure.

FIG. 17 illustrates a portion of an exemplary diagram 1700 containing a simple control loop. Four symbols have been identified and labeled 1702, 1704, 1706, and 1708 for illustrative purposes, each symbol representing either a device (e.g., sensor, actuator, controller, etc.) or a piece of equipment. Identifying a control loop in this example begins with recognizing all tags inside the symbols and all words outside the symbols. Next, for each word outside a symbol, the nearest tag inside the symbol is found. For the symbol at 1702, for example, the nearest tag inside the symbol is "TIC 1803." For a given symbol, all words having a distance greater than, say, 1.2 times the width of the symbol (i.e., words associated with other symbols) can be ignored. Then, the words are checked (e.g., using a rules engine) against a list of words from an industry standard like ISA to determine whether the words represent, for example, an alarm, a signal, a tag, or the like. If the word is a tag, then the tag number of the nearest tag is assigned to that word. For the symbol at 1702, for example, the tag number "1803" is assigned to the words "TE" and "TT" to produce "TE 1803" and "TT 1803." These tagged words are then added to the list of tags for the symbol. The tags for a given symbol include all the tags inside and outside the symbol.

Once all tags inside and outside the symbols are recognized, all tags with the same beginning identification letters and the same tag number are grouped together. In the FIG. 17 example, the tags "TIC 1803," "TV 1803," "TE 1803," and "TT 1803" are grouped together. These tags are used to define a simple loop 1710 that can be included as an extracted asset for the diagram 1700.

Returning once more to FIG. 6, at block 638, plant assets are organized in an asset registry for easy subsequent access and use. The assets are organized using namespace in order to uniquely identify each asset. As those having ordinary skill in the art understand, namespace is a set of names used to identify objects so there is no ambiguity when objects having different origins but the same names are mixed together.

At block 640, the merged flow graph for each diagram may be merged as part of the ML-based asset relationship building process 508 to create a single plant flow graph for the entire plant. Recall that a diagram like a PI&D or PFD represents the instruments or devices and equipment making up one unit, and that the asset extraction process discussed above results in the equipment names for a given unit having the same unit prefix and therefore uniquely identifiable. The device names likewise are created by prefixing the unit name. Connector names are also uniquely identifiable because each connector name contains the name of the source equipment, destination equipment, and pipe name.

Line indices or index numbers (e.g., 1, 2, 3, etc.) are local to each diagram and thus need to be made uniquely identifiable across multiple diagrams. This can be done, for example, by prefixing the line indices with the unit name or the corresponding diagram followed by the drawing number. For example, if the unit name is "UNIT1" and the diagram drawing number is "1116," then line index number "15" can be changed to "UNIT1_1116_15."

To create a single plant flow graph for the entire plant, flow graphs for each diagram in the plant may be generated as described above. Where needed, line indices may be made uniquely identifiable across the different diagrams as described above. The flow graphs for the various diagrams may then be merged by inserting all nodes and edges from each diagram flow graph (or the table representations thereof) into the plant flow graph (or the table representation thereof). Diagrams that are directly connected to one another will have connector nodes with the same names. When this occurs, the duplicate connector nodes are removed and a new edge is created in the plant flow graph by joining the lines that were to be connected by the removed connectors. All other nodes and edges should remain the same.

The resulting plant flow graph may be used to generate a visual representation of the asset hierarchy similar to the asset hierarchy 100 shown in FIG. 1. The asset hierarchy and the relationships underlying the asset hierarchy may then be stored as structured data, for example, in one or more JSON (JavaScript Object Notation) files for subsequent access and use by the industrial plant control system 300.

In some embodiments, the industrial plant control system 300 may be used to incorporate the structured data for the asset hierarchy and asset relationships into an ontological knowledge base, as mentioned above. The system then dynamically builds a plant engineering domain ontology from plant engineering data sources (which evolve over plant lifecycle phases). This generally involves: (1) extracting (by the system) the domain entities (i.e., type and data) from the structured data sources using metadata from unstructured data sources and machine learning techniques; (2) building (by domain experts) a semantic model using the entity type and also add the association relationships between the entities; (3) dynamically extracting (by the system) the entity data and building a knowledge graph based on the sematic model; and (4) providing (by the system) the ability for users to navigate the asset namespace and relationships to extract relevant information. Such an arrangement has a number of benefits.

As one benefit, automated control configurations can be performed using process narrative. Currently, control configuration is a manual process that is time consuming and requires strong control engineering background. With the industrial plant control system 300 described herein, a person who is not familiar with control engineering concepts should also be able to easily configure the system. This arises from the system's use of "process narratives" composed of ordinary language used by plant engineers. The system automatically translates the process narratives to control strategies and configurations. The process narrative can be converted to multiple control narratives by leveraging noun-verb pairs such as "Asset.Operation" in AutomationML (see IEC 62714) and State Based Control (see ISA 106, ISA 88, and ISA 95). The system translates process narrative to control logic using information from the asset templates, their relationships, namespaces, control strategy templates and rules.

As another benefit, test cases can be automatically auto-generated based on process narrative and documented validation. The industrial plant control system 300 automatically generates the test cases using the process narratives, control configuration, and asset ontology. The system then run the automated test scenarios to simulate the process in order to validate the control application.

Figure 18:
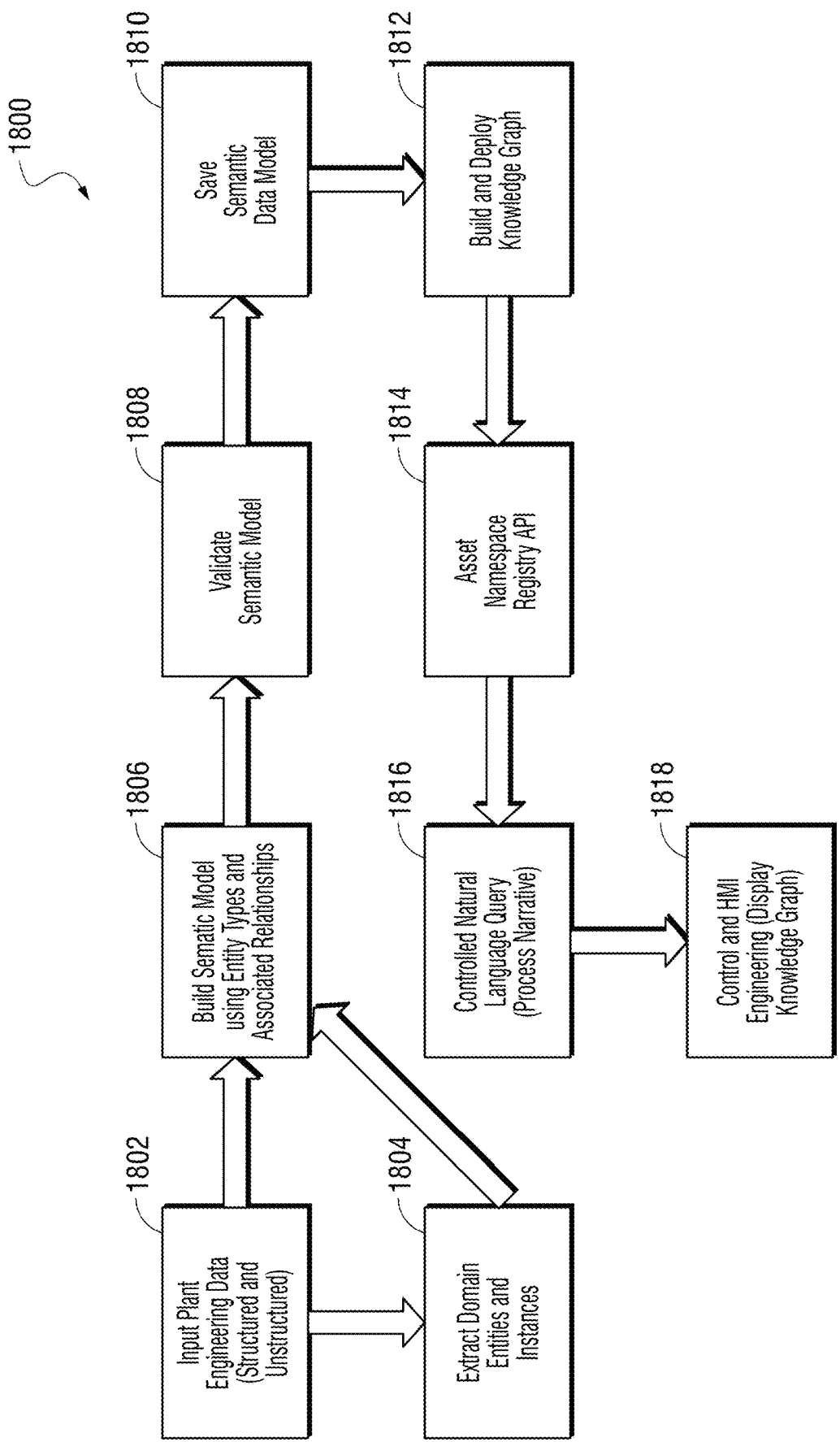
FIG. 18 illustrates an exemplary method for building a plant engineering domain ontology according to embodiments of the disclosure.

Referring now to FIG. 18, a flow chart is shown for an exemplary method 1800 that may be used with the industrial plant control system 300 to dynamically build a plant engineering domain ontology from plant engineering data sources. The method generally begins at block 1802 where plant engineering data sources are input into the system. The data sources may include the PI&Ds and PFDs used to generate plant asset hierarchy and asset relationships discussed above, as well as AutoCAD, SmartPlant, and Aveva Engineering diagrams. Other plant engineering data sources may include simulation models, instrument index, cable schedules, I/O allocation lists, configuration data, cross wiring tables, cabinet loading reports, system audit reports, historical data, alarms and events, and the like.

FIGS. 19-29 show exemplary plant engineering data sources that may be used to generate an asset hierarchy and/or a knowledge graph. These plant engineering data sources will appear familiar to those skilled in the art. For example, FIG. 19 illustrates exemplary alarm data at 1900.

FIG. 20 illustrates an exemplary cabinet loading report 2000. FIG. 21 illustrates an exemplary control database at 2100. FIG. 22 illustrates an exemplary cross wiring report at 2200. FIG. 23 illustrates an exemplary field wiring index at 2300. FIG. 24 illustrates exemplary historical data (tag data) at 2400. FIG. 25 illustrates an exemplary instrument index at 2500. FIG. 26 illustrates an exemplary asset hierarchy at 2600. FIG. 27 illustrates an exemplary nest loading report at 2700. FIG. 28 illustrates an exemplary plant asset index at 2800. FIG. 29 illustrates an exemplary process control narrative at 2900. Such data sources and other plant engineering data sources, including HMI specifications (see FIG. 34), may then be used to generate an asset hierarchy and/or a knowledge graph.

Returning to FIG. 18, at block 1804, the system extracts domain entities and instances for the domain entities from the plant engineering data sources. The data sources may include structured and unstructured data sources. For example, entities (also referred to as types or classes), properties (also referred to as attributes), and relationships may be extracted from the data sources. The entities may be used to specify the ontology's domain and range, and values of properties may be used to specify the ontology model's range. The semantic model may comprise a set of triples built from the ontology's domain and range. A triple may specify a subject entity, a predicate relationship or attribute, and an object entity or value. The subject entity may be an entity from the ontology's domain. The object entity or value may be an entity or value from the ontology's range. Instances of entities and values may be extracted from the data sources. For example, the semantic model may specify a triple with subject "Unit," predicate "has," and object "Device." A triple comprising instances of the corresponding subject and object may include "Unit01" (an instance of entity "Unit") "has" (the predicate) "ControlValve01" (an instance of entity "Device").

Multiple data extraction techniques can be used for each data source, both structured and unstructured, from the plant engineering data sources. The system can differentiate structured and unstructured data based on the file format or database type. Unstructured data files (e.g., email messages, word processing documents, videos, images, webpages, etc.) often include text and multimedia content without any schema, while structured data files (e.g., spreadsheets, CSV files, XML files, RDBMS, time series, graph database, etc.) contain a schema or metadata. The system can extract domain entities from these structured data sources using the schema or metadata. In a CSV file format, for example, plain text data is separated by commas with each new line in the CSV file representing a new database row and each database row having one or more fields separated by a comma. The system can use this schema to extract domain entities from the data source. An example can be seen in FIG. 25, where domain entities were extracted from an exemplary instruments index data source in CSV format. Among the domain entities and associated relationships extracted from this data source are Plant, Area, Unit, Loop, Tag, Process Function, and the like, as indicated in the first row of the table. Instances of these domain entities are shown in the subsequent rows.

For unstructured data, such as P&IDs, PFDs, Process Control Narratives (PCNs) and other image or unstructured text formats, the system extracts domain entities and associated relationships from the unstructured data sources into structured data using machine learning. For reference, a Process Control Narrative (PCN) is a functional statement describing how device-mounted controls, panel-mounted controls, PLCs, HMIs, and other processor-based process control system components should be configured and programmed to control and monitor a particular process, a process area, or facility. A PCN is the essential link between process design and control system design. For PCNs, the system uses Named Entity Recognition (NER) techniques to extract domain entities, such as pumps, valves, locations, alarm conditions, and the like, from the process narratives. NER is a technique used in information processing with unstructured text. The technique labels sequences of words in the text that are the names of things, such as things, person names, organizations, locations, time expressions, quantities, monetary values, percentages.

FIG. 30 is a table 3000 showing an example of domain entity types and instance data extracted into a file having a tabular format. The domain entity types in the table include Controller, Compound, Block, Tag, and so forth, while the corresponding instance data include (for the first row) CP2801, CF101_011900, PT038, 011900PV038, and the like.

Returning to FIG. 18, once the domain entities and relationships have been extracted, then at block 1806, a user (e.g., a domain expert) builds a semantic model using the extracted entity types and associated relationships. FIG. 31 shows an example of a user interface that may be used by a domain expert to build a semantic model.

In FIG. 31, a user interface 2100 is shown that allows the user to specify the semantic relationships between entities extracted from data sources. From this interface, the user can browse the entity types manually from various data sources and filter the entities required for the semantic model. For example, the user can select two entities such as Source and Target and create a named relationship therebetween. The schema can be defined at conceptual level, which is a logical model. The user can then the domain specific relationships between the entities extracted from the data sources. Typical relationships are "is-a" representing a parent-child relationship, "has-a(part-of)" representing a containment relationship, and the like. In the example, the user has specified that a source "Plant" is related to a target "Area" by the relationship "has Area." The user can also add additional contextual information as entity attributes. For example, the user can add Type, Severity, Priority as attributes for an Alarm entity.

In some embodiments, instead or in addition to being defined by a user, the semantic relationships may be determined automatically from, for example, primary and foreign key relationships specified in Relational Database Management System (RDBMS) tuples or parent-child nodes in XML documents. Properties may be added to provide additional contextual information (e.g., for entity "Alarm," the properties "type," "severity," or "priority" may be added). The resulting semantic model may be validated against a predetermined set of rules. The rules may be defined by, for example, standard ISA-106 ("Procedural Automation for Continuous Process Operations"). Using ISA-106, a triple "Device has Unit" may be flagged for correction during validation because the standard specifies that Units have Devices rather than vice versa. Public ontologies and vocabularies in dictionary files may be used for validation instead or in addition to standards.

Returning to FIG. 18, once the semantic model has been built, then at block 1808, the model is validated. Semantic validation refers to the process of verifying that the data elements are logically valid. For example, a data element such as Equipment-Has-Area would not be valid under the ISA 106 schema because equipment would not have an area (semantic models typically standardize the entity relation types according to an industry standard). In some embodiments, the system automatically validates the domain specific relationships between the entities that were created in block 1806. To this end, the system can maintain standard terms, their definitions, as well as references to public ontologies and vocabularies in dictionary files, which can be used as a reference for validation. The system also provides the options to validate and modify the system-generated relationships by the domain experts manually.

At block 1810, the validated semantic model is saved to create the ontology. In some embodiments, the semantic model is saved according to one of the following well-known semantic model formats: OWL/XML, JOSO-LD, and RDF/JSON. As an alternative, the semantic model may be persisted by converting the model into Labeled Property Graph Model in GaphSON format. If the semantic model is converted into W3C Ontology, then the semantic model knowledge graph can be persisted in RDF triple stores like AllegroGraph, Stardog or Amazon Neptune. If the semantic model is converted into LPG (Labeled Property Graph), then the knowledge graph therefor can be persisted into Graph Database formats like GraphDB or Neo4j or Azure Cosmos DB.

At block 1812, the system may use the semantic model to build and deploy a knowledge graph. As alluded to above, a knowledge graph is basically a graph that can be used to navigate and visualize the relationships between components (i.e., a physical model of the data). The semantic model defines the relationship between the source and target entities in the knowledge graph at a conceptual level (e.g., "Area-has-Unit"). The system extracts the instances related to the ontology classes and builds the knowledge graph using the associated relationships and the contextual information. The knowledge graph thus represents a collection of interlinked entities that enhances the ability of a user to search for desired information. The knowledge graph can be represented in the database system using LPG, RDF, or similar graph models. An exemplary visualization of a knowledge graph is depicted in FIG. 32.

Figure 32:
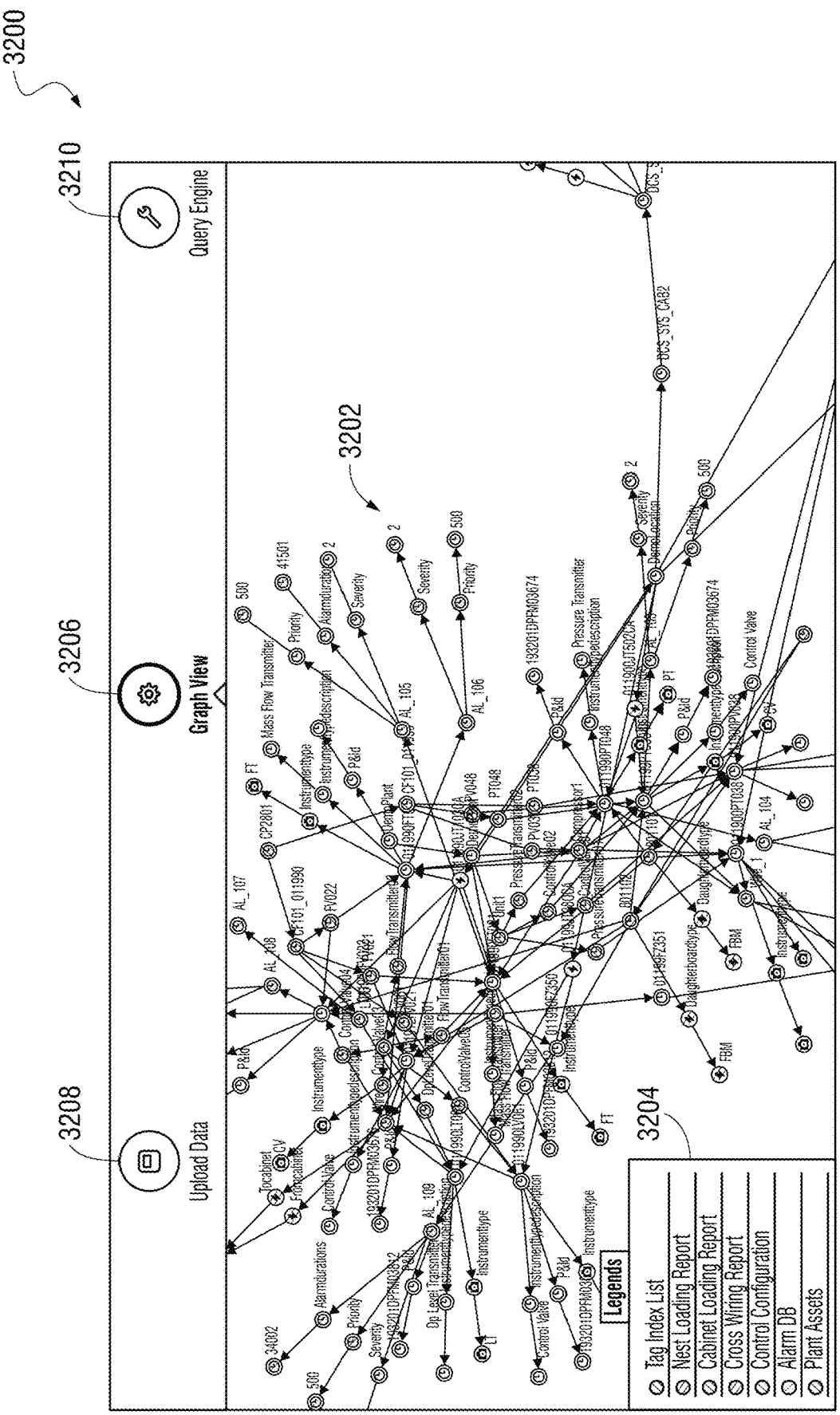
FIG. 32 illustrates an exemplary HMI display screen showing a knowledge graph according to embodiments of the disclosure.

Referring to FIG. 32, a visualization of a knowledge graph 3200 can be seen in which entities and relationships are shown as a plurality of labeled-property nodes, one of which is indicated at 3202. Both the nodes and their relationships are named and can store properties represented by key/value pairs. Nodes can be labeled so as to be easily grouped with similar nodes. The edges representing the relationships have two main qualities: they always have a start node and an end node, and they are directed, making the graph a directed graph. Relationships can also have properties, which is useful in providing additional metadata and semantics to relationships of the nodes. A legend 3204 provides an indication of what each node 3202 represents on a color-coded basis, for example, blue for tag index list, green for nest loading report, orange for cabinet loading report, and so forth. The knowledge graph 3200 can be selected by choosing a graph view option 3206 and is one of several display screens that are available from an HMI according to embodiments of the present disclosure. Users can select other display screens from the HMI by choosing the option therefor, such as an upload data option 3206 to upload data and a query engine option 3208 to search for data.

Figure 33:
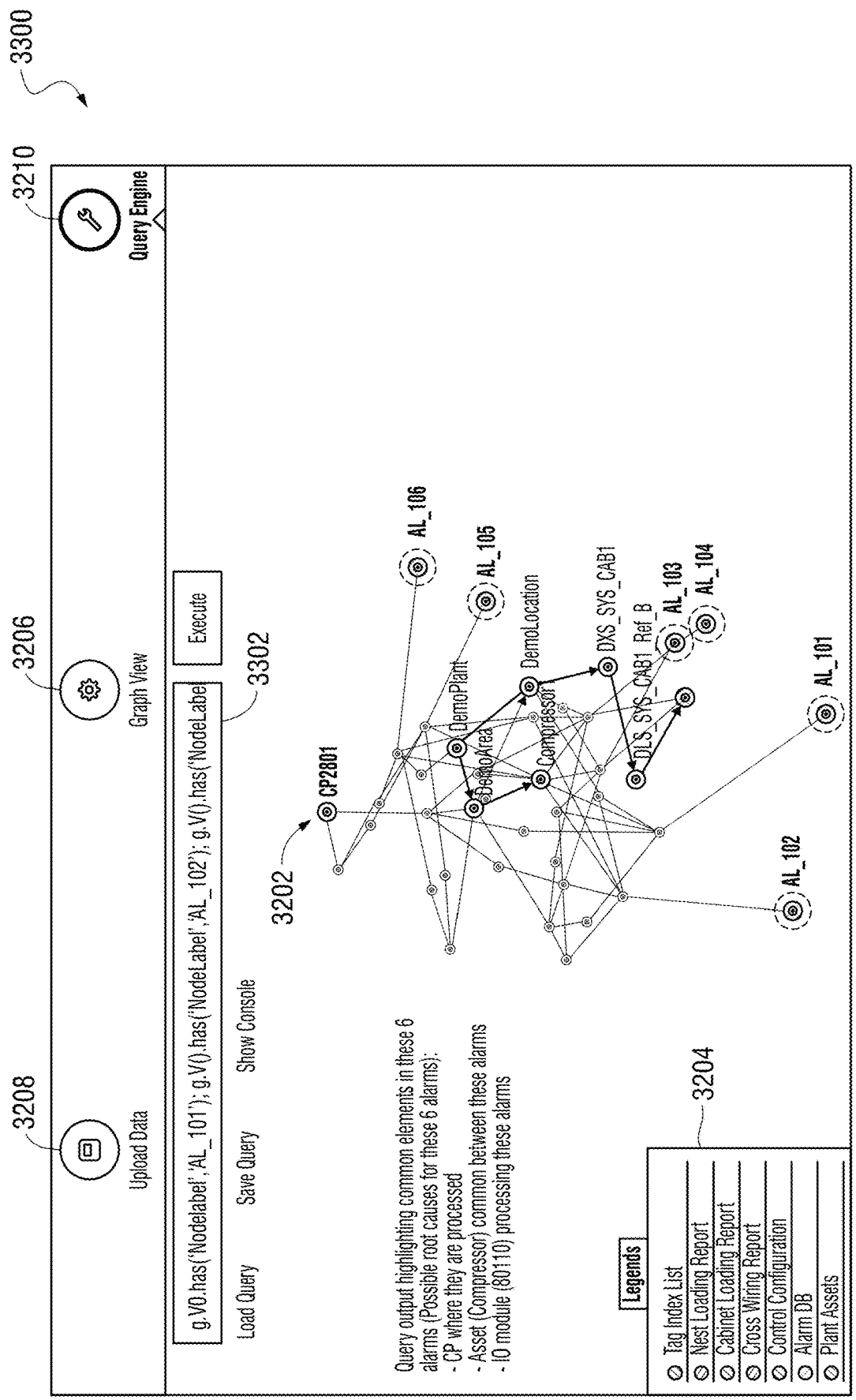
FIG. 33 illustrates an exemplary HMI display screen showing user query results according to embodiments of the disclosure.

FIG. 33 illustrates an example of a query display screen 3300 available from the HMI according to embodiments of the present disclosure. In this screen, the user can search for data by typing natural language queries into a search box 3302. For example, the user may ask that the HMI display or otherwise indicate the alarms that typically are triggered during a normal plant startup process by entering the query "What are the expected alarms during a startup sequence?" into the search box 3302. In response, the HMI may display the requested alarms either graphically (nodes with dashed circles) or in text form by displaying the alarms' identifiers. The user can also select and drag nodes representing the type of data the user desires into the search box 3302. In the example shown, the user can drag and drop the six alarms that were returned into the search box 3302. By virtue of the knowledge graph, the HMI can quickly highlight all common assets for the six alarms, indicated by the nodes without dashed circles, and gray out or suppress all other nodes into the background. The common assets returned, which may include the control processor where the alarms were processed, the assets shared by these alarms, the I/O modules processing the alarms, and the like, indicate possible root causes for the alarms.

In some embodiments, users and plant operators can also enter commands to initiate operations. The HMI may interpret commands written in natural language. For example, to instruct the HMI to initiate filling up a component labeled "Tank 01," the command "Fill Tank 01" may be entered into a command bar (not expressly shown).

Returning to FIG. 18, once the ontology is built, then at block 1814, the system may provide an asset namespace registry API in order for different applications to consume the data. Recall from earlier (FIG. 6) that plant assets are organized into an asset registry using namespace. In some embodiments, a RESTful Application Program Interface (e.g., an Azure Active Directory Graph API) may be generated to permit downstream applications to extract information from the knowledge graph.

At block 1816, the system provides a way for users to retrieve data based on a process narrative. In some embodiments, the user may retrieve the data using natural-language questions to search for the data. The system may translate the natural-language queries into, for example, SPARQL queries or Gremlin queries. Downstream applications may comprise, for example, an HMI through which commands may be issued from converted process narratives and/or other natural-language commands.

At block 1818, plant control processes and an HMI for the processes may be designed and developed (i.e., control and HMI engineering) to allow a user to use the system 300 to control the plant and the various plant assets. This involves processing the plant assets and asset relationships from the asset models to create an HMI asset model. The HMI asset model arranges the assets in a hierarchical structure (see FIG. 37), unlike conventional solutions that are discrete in nature (i.e., created based on individual P&ID diagrams). The HMI may then use the HMI asset model to automatically create a unique, continuous HMI display resembling a two-dimensional plan view at the plant level that includes symbols for each asset and lines that represent processes, electrical connections, data links, and the like, extending between the symbols. Plant operators can then navigate horizontally and vertically and can zoom in and out on (i.e., along a Z-axis) the two-dimensional view to move across different assets and verify their behavior.

In some embodiments, the HMI can dynamically change the assets that are displayed to the user based on a change in position of the user on the HMI screens and the alarms generated at runtime. The HMI assets shown at runtime can be decided based mainly on two factors: (i) static weights assigned to the assets based on asset hierarchical details available in the engineering diagrams (e.g., PFD, P&ID, etc.); and (ii) dynamic weights assigned to each equipment that raises an alarm. Thus, at runtime, the HMI can display a view that includes assets having a greater weight, or if there are alarms, assets that have alarms. The HMI can also dynamically change the view to include assets for which alarms are recently raised. Alarms on critical equipment will be given a "high" or "high-high" indicator (e.g., exclamation mark, red color, etc.) and will get more focus and the complete alarm chain will get highest weightage at runtime. To design the HMI, design specifications for the HMI need to be established.

Figure 34:
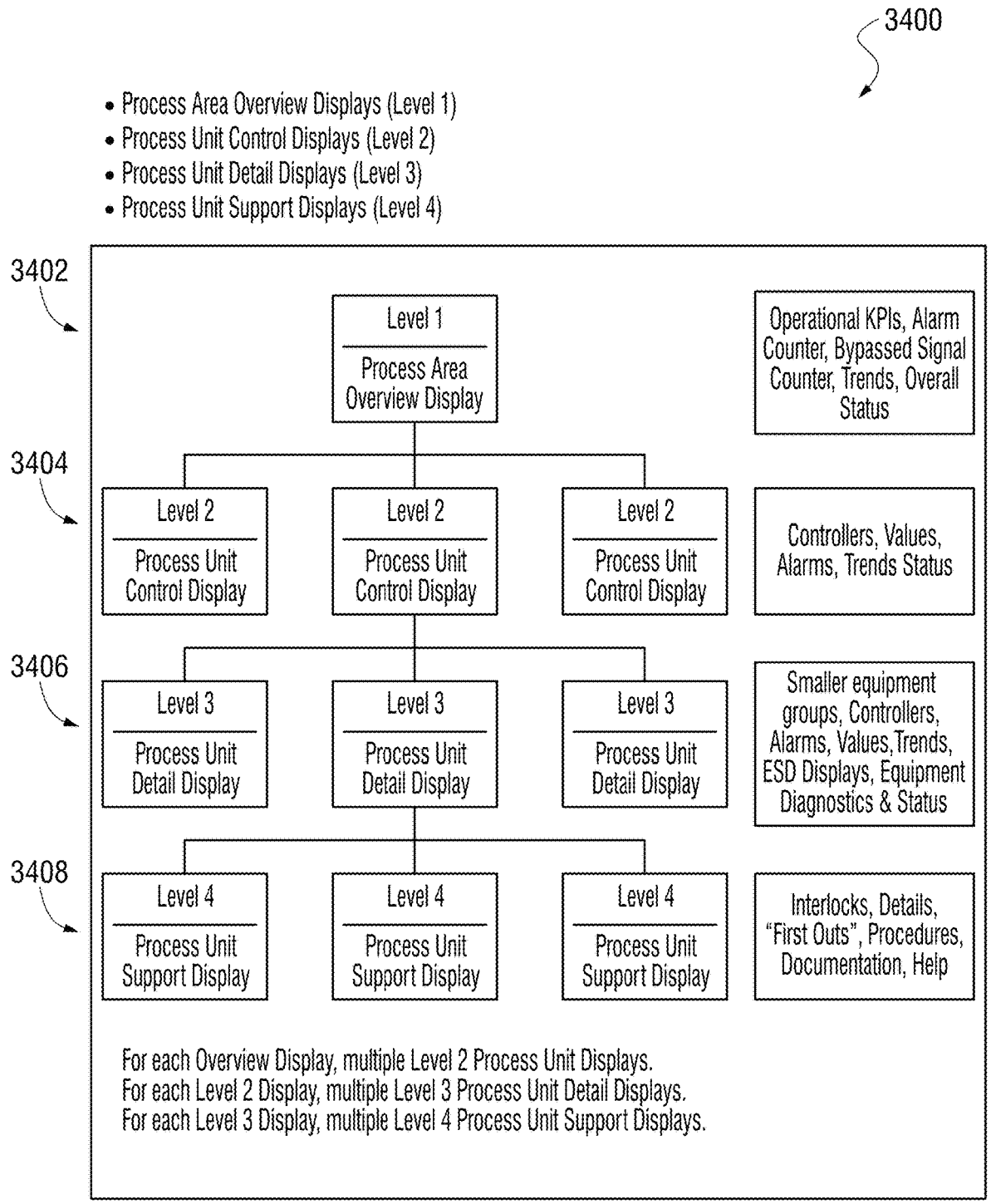
FIG. 34 illustrates an exemplary HMI design specification according to embodiments of the disclosure.

FIG. 34 shows an exemplary design specification 3400 for an HMI according to embodiments of the present disclosure. The specification 3400 specifies a hierarchical structure for the HMI that allows the HMI to display certain process control details, including process equipment details and instrumentation control details, in a hierarchical arrangement. In this example, the HMI is arranged in several hierarchical display levels 3402, 3404, 3406, 3408. Level 1 displays a process area overview, including information such as operational KPIs (key performance indicators), an alarm counter, bypassed signals counter, trends, overall plant statuses, and the like. The next level, Level 2, displays process unit controls, including controllers, alarms, trends, and statuses. The next level, Level 3, displays process unit details, including smaller equipment groups, controllers, alarms, trends, ESD displays, equipment, diagnostics, and statuses. The next level, Level 4, displays process unit support details, including interlocks, details, "first outs," procedures, documentation, and help. Other HMI design specifications may include specifications related the graphical display, such as alarm priority colors (e.g., red, yellow, orange, etc.) as well as colors indicating status (e.g., out of service, etc.) and function (e.g., feedback, trend lines, etc.). The meanings of icons, symbols, and lines (e.g., solid, dashed, dotted, etc.) may also be specified as well as engineering units (e.g., metric, English, etc.), and so forth. These HMI specifications along with the data and information extracted from various plant engineering data sources as discussed above may then be used to build an HMI asset model.

Figure 35:
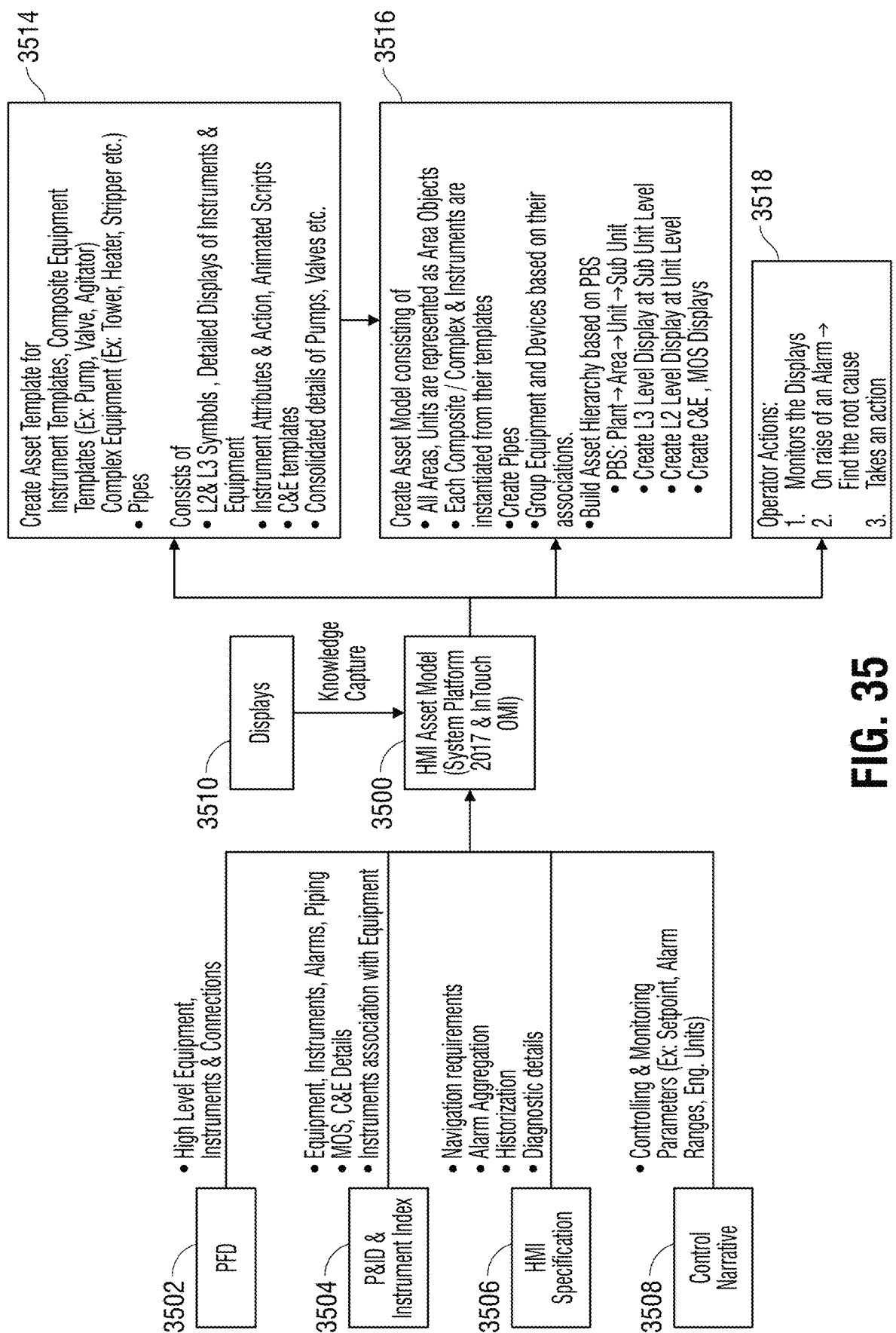
FIG. 35 illustrates exemplary inputs for building an HMI model according to embodiments of the disclosure.

FIG. 35 illustrates an exemplary HMI asset model 3500 according to embodiments of the present disclosure. The HMI asset model, as the name suggests, comprises asset models processed and used by the HMI for display to the users. For the present purposes, the HMI asset model includes the plant assets and relationships (asset hierarchy), ontological knowledge base, and various plant engineering data sources discussed previously. The HMI asset model is thus composed of PFDs 3502 (e.g., high level equipment, instruments, connections, etc.), PI&Ds and instrument index 3504 (e.g., equipment, instruments, associations therebetween, alarms, piping, maintenance override graphics (MOS) and cause and effect (C&E) details, etc.), HMI specification 3506 (e.g., navigation requirements, alarm aggregation, historization, diagnostic details, etc.), control narratives 3508 (e.g., controlling and monitoring parameters, setpoints, alarms, ranges, engineering units, etc.) as well as knowledge captured (e.g., from maintenance records, previous corrective actions, user experiences, etc.) via engineering displays 3510. This model is automatically updated as the content of the various data sources change and assets are added and/or deleted, making the model a dynamic HMI asset model.

Once the HMI asset model 3500 (or rather the content thereof) has been established, the model may be used in developing an HMI according to embodiments of the present disclosure. Developing an HMI based on the HMI asset model can involve creating templates 3514 for the various assets (e.g., instruments, equipment, composites and combinations thereof, etc.). These templates may include, for example, level symbols (e.g., Level 2, Level 3, etc.), detailed displays of instruments and equipment, instrument attributes and actions, animated scripts, control engineering templates, consolidated details of pumps, valves, and the like. Developing the HMI from the HMI asset model can also involve creating other asset models 3516 in which all areas and units are represented as area objects, each composite and/or complex combination of instruments are instantiated from their templates. This process may involve assigning more weight to some equipment and devices relative to other equipment and devices, with the former being graphically emphasized. New equipment and devices introduced, for example, through a control narrative, may be added and the asset hierarchy adjusted accordingly. Equipment and devices may be grouped based on their associations in these asset models.

In addition to the above, the HMI asset model can also be used to build control applications that control operation of the various plant assets. As mentioned earlier, plant assets can be extracted from unstructured data like engineering diagrams using machine learning to recognize one or more assets. This procedure can also extract one or more control loops from the engineering diagrams based on one or more of the equipment, instruments, connectors, and lines to build the dynamic HMI asset model. An auto-control generation procedure may then be used to read one or more control loops from the dynamic asset model and generate control logic for the control applications. The control logic connects the control applications with the actual plant equipment to allow the control applications to read or otherwise acquire process values and control operation of the equipment, devices, instruments, and so forth. In other words, the HMI processes the assets and asset relationships and creates the HMI asset model, arranging the assets in a hierarchical structure. This process also links the attributes of each HMI asset with a corresponding control I/O reference so that at runtime, if an operator turns on a valve in a control application in the HMI, its control value will be propagated to the corresponding device in the plant via the control I/O reference (linked in the HMI asset), thus turning on the valve in the plant.

The HMI developed from the HMI asset model can then be used by a user to monitor various displays and easily find the root cause of alarm, for example. In some embodiments, such an HMI may be developed using an HMI development platform like the System Platform 2017 InTouch OMI (operations management interface) available from Wonderware West of Houston, Texas Other HMI development platforms may of course be used within the scope of the present disclosure.

Figure 36:
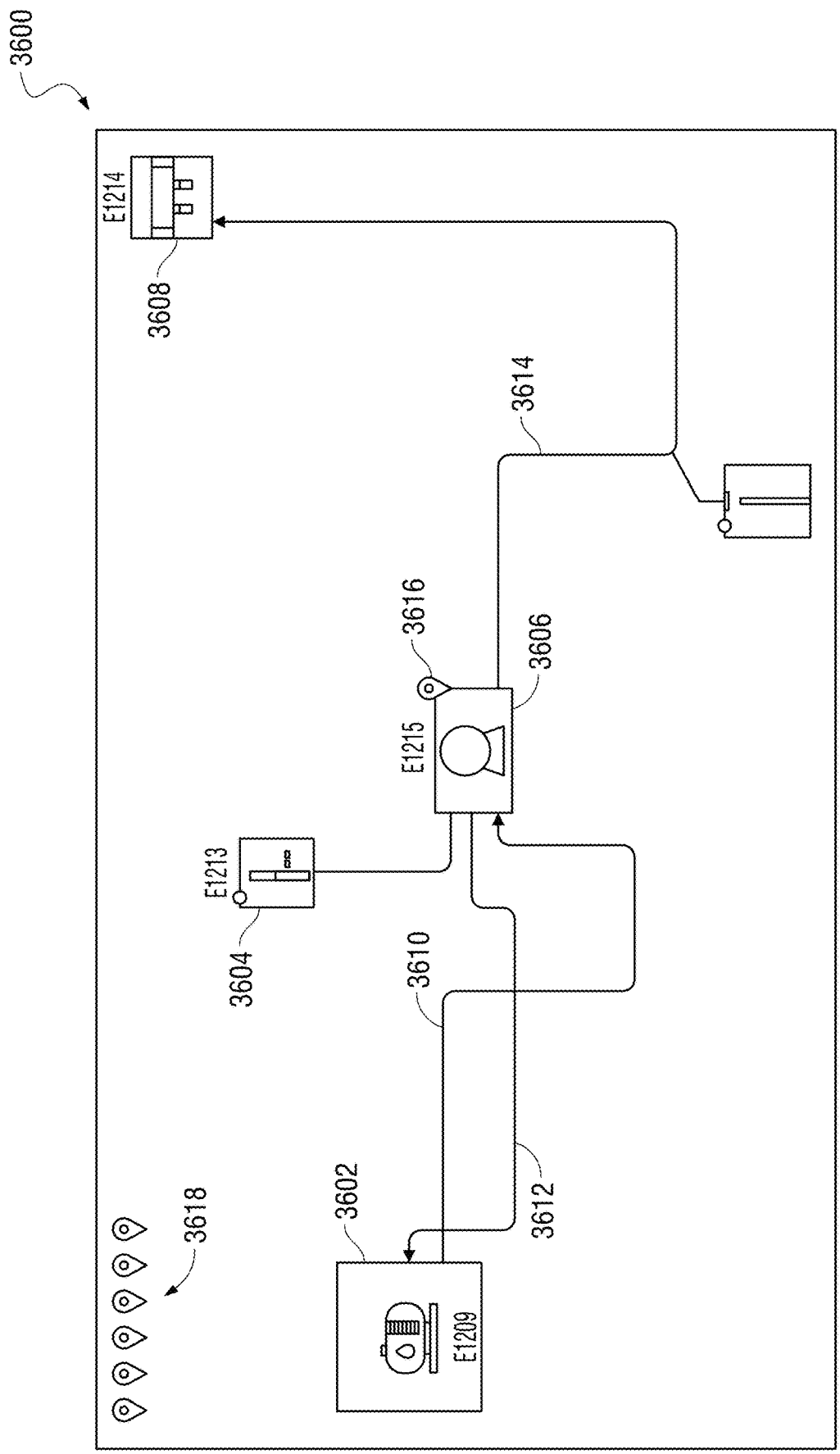
FIG. 36 illustrates exemplary HMI screen showing alarm root cause determination according to embodiments of the disclosure.

Referring next to FIG. 36, in some embodiments, the HMI according to the present disclosure can process alarms raised by various devices and automatically identify the root causes of the alarms. The HMI can determine the root cause of an alarm mainly by two factors: (i) process/material flow as defined in an engineering diagram; and (ii) control flow defined in the engineering diagram and any control narrative. In the case of a process flow, the HMI first finds the device nodes causing the different alarms. For each device node, the HMI retrieves the equipment node corresponding to the device node. For that equipment node, the HMI retrieves any upstream equipment node connected to that equipment node which also has a device that is raising an alarm. This step is repeated for the neighboring node until the HMI finds a connected equipment to which no devices are connected that have an alarm. This creates a chain of alarms that allows the HMI to determine the root cause of the alarm by finding the equipment at the highest level in the chain that has an alarm.

In the FIG. 36 example, a two-dimensional plan view at the plant level is displayed by the HMI on a screen 3600 that includes symbols 3602, 3604, 3606, and 3608 representing assets and lines 3610, 3612, and 3614 extending between the symbols that represent processes, electrical connections, data links, and the like. Plant operators can then navigate horizontally and zoom in and out within the two-dimensional view to move across different assets and verify their behavior. In this example, material flows from equipment E1215 (pump) to equipment E1214 (boiler) and there is a pressure drop at the inlet of equipment E1214 (boiler). The drop in pressure causes an alarm to be raised by the device (measurement instrument) at the inlet of equipment E1214 (boiler). The problem could be with equipment E1215 or with equipment E1209. However, there is no alarm at equipment E1209, so the HMI determines that the problem is at equipment E1215 (pump). In this example, the throughput of equipment E1215 (pump) has been reduced and hence there is pressure drop at the connected downstream equipment E1214 (boiler). Thus, although the alarm is raised by the measurement instrument at the boiler E1214, the HMI would identify the root cause of the alarm as the pump E1215 in this scenario. The HMI assigns additional weight to this equipment for display purposes and places an alarm bulb 3616 next to the equipment. Other alarm bulbs representing other alarms found by the HMI are aggregated at 3618.

Thereafter, the HMI can allow the plant operator to correct the root cause analysis identified by the system. For example, the operator can manually select a different equipment and set that equipment as the root cause for the alarm instead of the system-identified root cause, and can also manually identify a corresponding alarm chain in some embodiments. These corrections made by the operator can be fed back to the system to dynamically update the machine learning algorithms to thereby make the system more accurate for subsequent alarm root cause analysis.

Figure 37:
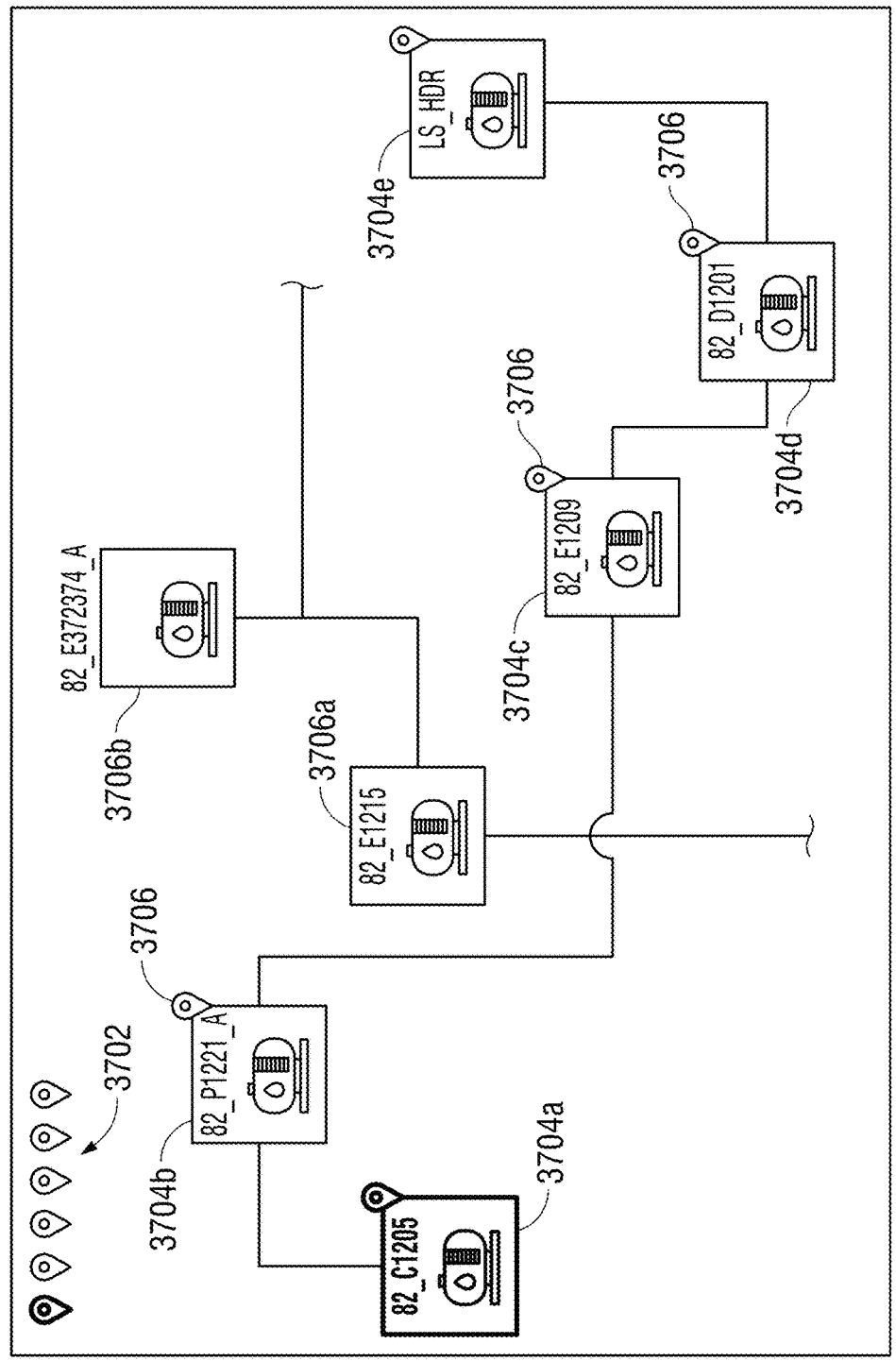
FIG. 37 illustrates an exemplary HMI screen showing plant level alarm aggregation according to embodiments of the disclosure.

Referring now to FIG. 37, in some embodiments, an HMI according to the present the disclosure may aggregate the alarms in a plant and provide a display screen 3700 showing a plant level view of the aggregated alarms. In some embodiments, the system may aggregate alarms by obtaining a list of all equipment generating alarms and identifying the first equipment from the list. The system adds this equipment to a new alarm cluster and checks whether a neighboring equipment is also generating alarms. If yes, then the system adds the neighboring equipment to the current alarm cluster. The process is repeated with the next equipment on the list until all equipment and neighboring equipment have been processed. The plant level aggregated alarms are depicted as a series of bulbs 3702 in a designated area of the screen 3700 (e.g., upper left corner) in the example shown, although a different location or different icons or graphical symbol may certainly be used for the alarms. Each of the bulbs 3702 corresponds to a respective component (e.g., device, equipment, etc.) for which an alarm was raised in the plant. As can be seen, there are five components 3704*a, b, c, d, e* for which an alarm was raised, each component bearing a bulb icon 3706 to indicate an alarm condition at that component.

Selecting (e.g., by tapping, double-clicking, etc.) one of the components 3704*a-e* causes the HMI to display information about that component, including which downstream components may be potential root causes for the alarm. In some embodiments, the system may determine potential root causes for an alarm by identifying the alarm at the highest equipment level, then finding a source equipment connected to this equipment that also has alarm. The system then drills down on the source equipment to find a connected subsequent equipment that also has alarm. The process is repeated until the lowest connected equipment that has an alarm is found.

Figure 38:
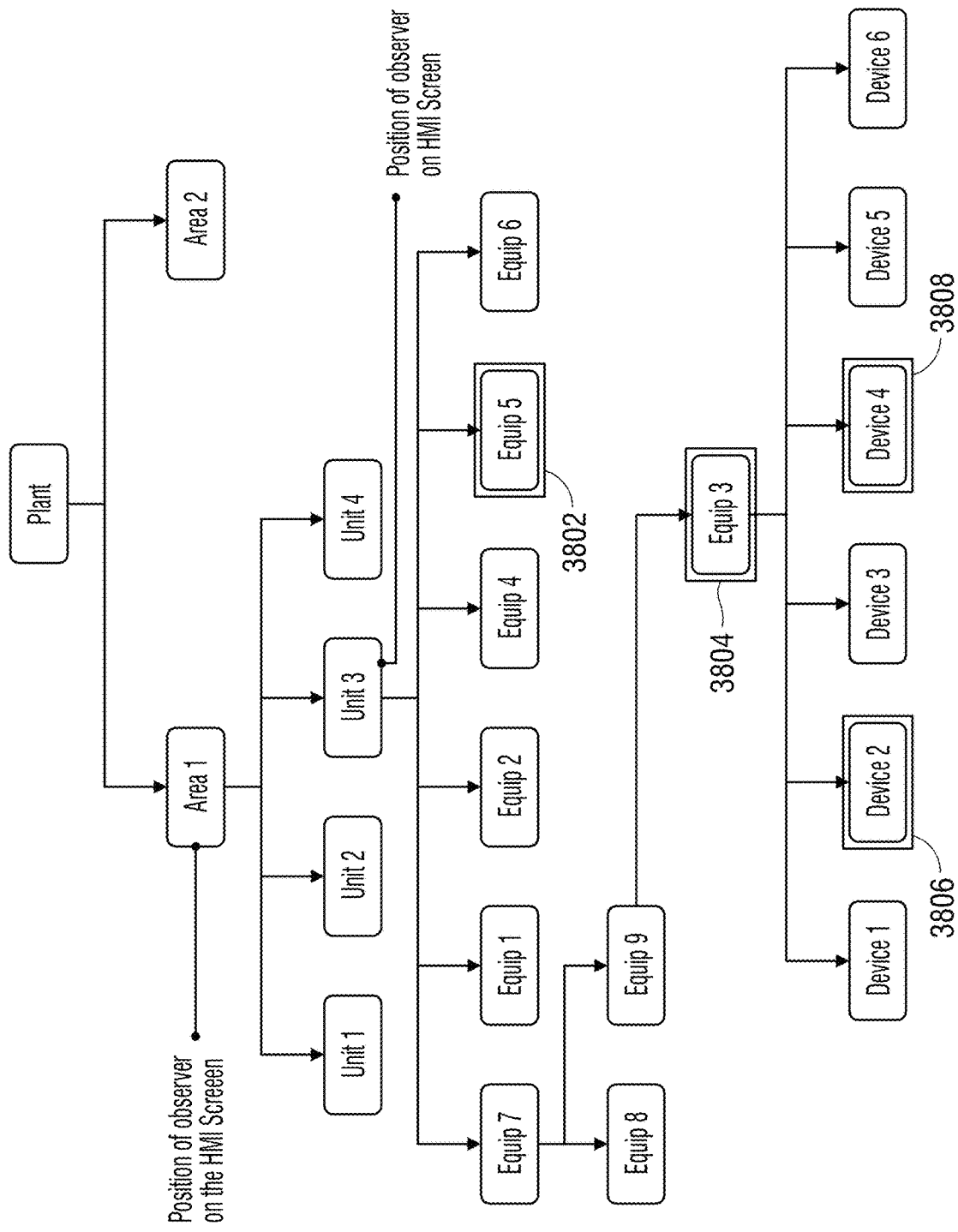
FIG. 38 illustrates exemplary dynamic zooming according to user position on an HMI screen according to embodiments of the disclosure.

FIG. 38 graphically illustrates an embodiment of an HMI that can dynamically zoom in (and out) on assets according to the position of a user/observer on an asset hierarchy screen. The position of the observer on the hierarchy screen is determined mainly by two factors: (1) the position on the ground as determined by the screen coordinates (e.g., x and y coordinates), and (2) the height of the observer from the ground. Based on the position of the observer on the screen, relevant information around the asset model is provided for viewing. Consider, for example, when the user is positioned at Area 1 with respect to the HMI screen and there are alarm conditions at Equipment 5, Equipment 3, Device 2, and Device 4. In this example, the HMI screen would show Equipment 7, 1, 2, 4, 5, and 6 and any relevant information about the equipment, but not Equipment 8, 9, or 3, or any of the devices connected to Equipment 3 yet. Assume the user now zooms in so that the position of the user is at Unit 3. In that example, the HMI screen would show Equipment 7, 1, 2, 4, 5, and 6 as before, but would also show Equipment 8, 9, or 3. Once the user moves further down to Equipment 5, then the HMI screen would show Devices 1, 2, 3, 4, and 5 and any relevant information about these devices. The HMI screen automatically removes any equipment that are above the level of the user.

Figure 39:
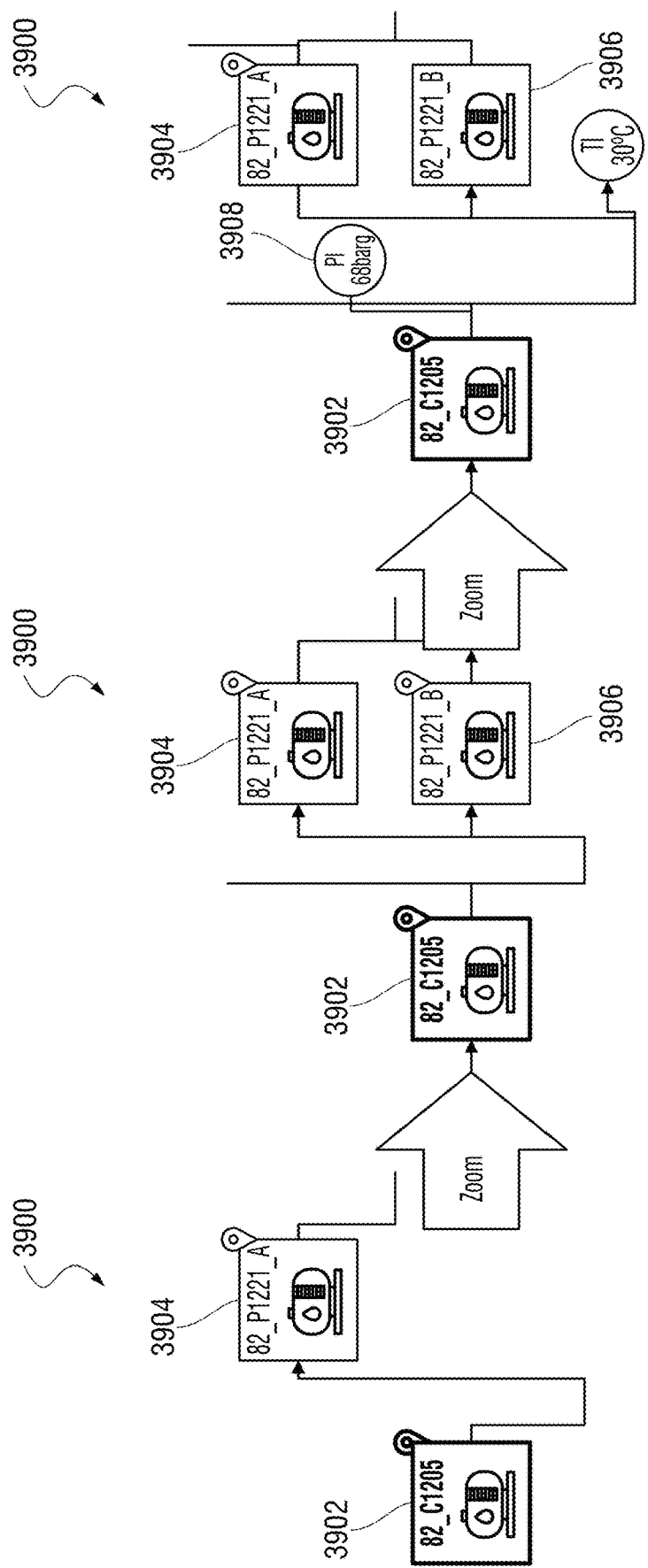
FIG. 39 illustrates exemplary HMI screens showing dynamic zooming according to embodiments of the disclosure.

FIG. 39 illustrates an exemplary HMI display screen 3900 that can dynamically zoom in (and out) on assets according to the position of a user/observer according to embodiments of the present disclosure. Based on the zoom level as determined by the current position of the user and the current active alarms in the plant, the dynamic HMI display screen 3900 shows relevant information around the asset model. In the example on the left of FIG. 39, the HMI display screen 3900 shows the connectivity between assets 3902 and 3904. In the middle example, the user has zoomed in, so the HMI display screen 3900 remaps the connectivity to show an additional asset 3906 on the screen. In the example on the right, the user has zoomed in further, so the HMI display screen 3900 remaps the connectivity again to show yet an additional asset 3908 on the screen.

Figure 40B:
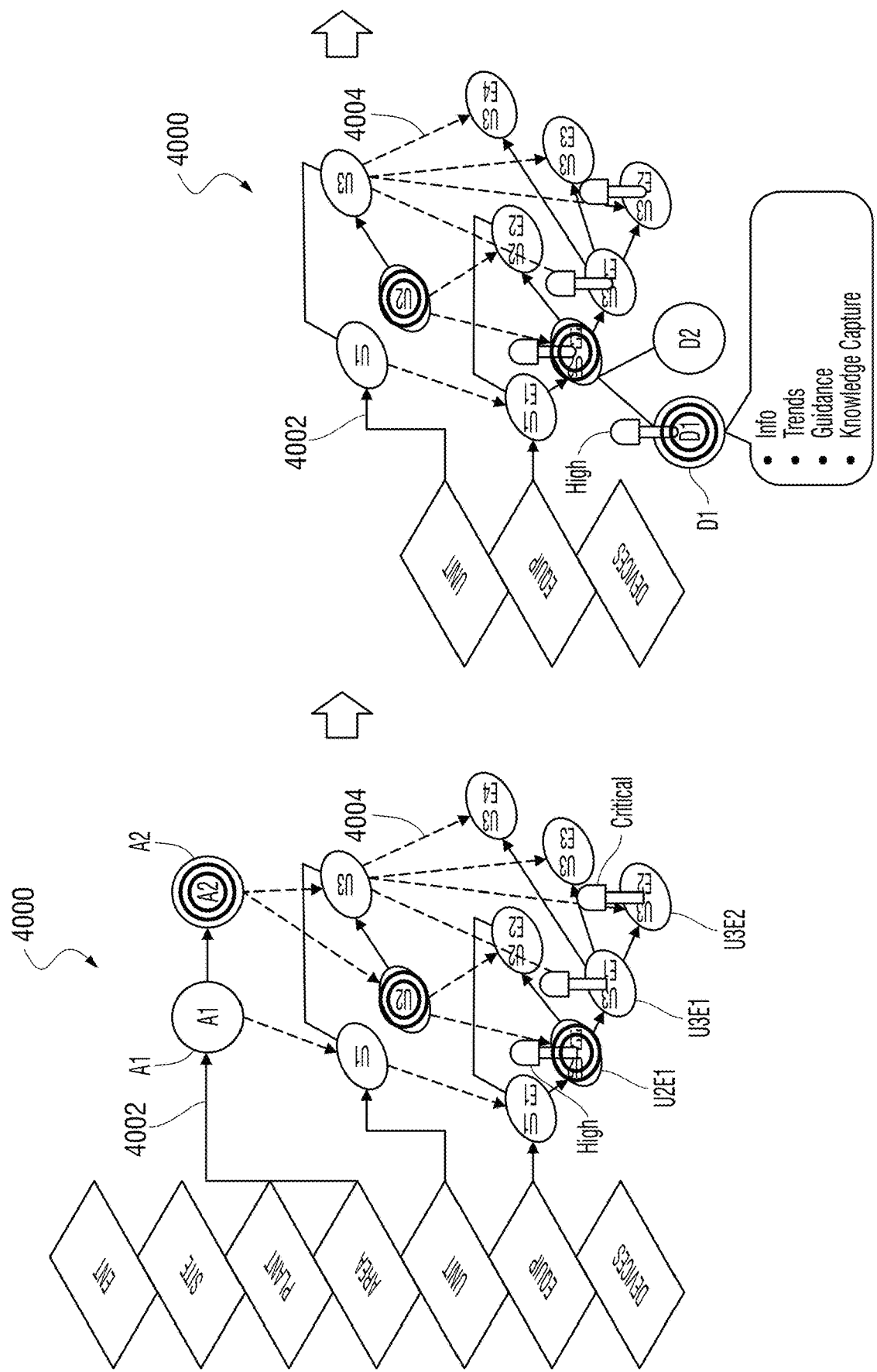

Referring now to FIGS. 40A and 40B, an HMI according to embodiments of the present disclosure can also perform alarm aggregation at an area Level, in addition to the plant level alarm aggregation discussed above. FIG. 40A graphically illustrates an exemplary embodiment of such an HMI in which the HMI uses a 2-dimensional view of the plant assets to show area level alarm aggregation. Starting with the example on the left, solid lines such as line 4002 indicate horizontal connectivity within a plane and dashed lines such as line 4004 represent vertical connectivity across multiple planes (i.e., a 2-dimensional view). As can be seen, area level assets A1 and A2 have alarm conditions that are indicated by the high and critical alarm icons, respectively. When the user selects A2 (e.g., by tapping, clicking, etc.), the HMI takes the user to the example on the right, where the user finds a critical alarm at asset U3 and a high alarm at asset U2.

If the user selects U2, the HMI takes the user to the example on the left in FIG. 40B, where the user finds a critical alarm at equipment U3E2. From here, the user will be able to visually view the source of the critical alarm at U2E1, which cascaded through U3E1 and also U3E2. Assuming the user selects U2E1, the HMI takes the user to the example on the right in FIG. 40B, where the user will be shown the device level assets, including the source of the problem that cause the alarms, D1. Selecting D1 will provide the user with information about that device, any trends seen at the device, any support and guidance available for the device, and any knowledge captured about the device.

Accordingly, as described herein, embodiments of the present disclosure provide systems and methods for controlling industrial process automation and control systems. The methods and systems automatically, and through the use of machine learning (ML) models and algorithms, extract plant assets from engineering diagrams and other plant engineering data sources, establish asset relationships to create a plant asset registry and build an asset hierarchy from the plant assets, generate an ontological knowledge base from the plant asset hierarchy, and provide an HMI for controlling the industrial process based on the plant asset hierarchy and the ontological knowledge base.

Such embodiments of the present disclosure may comprise a special purpose computer including a variety of computer hardware, as described in greater detail below. Embodiments within the scope of the present disclosure also include computer-readable media for carrying or having computer-executable instructions or data structures stored thereon. Such computer-readable media can be any available media that can be accessed by a special purpose computer and comprises computer storage media and communication media. By way of example, and not limitation, computer storage media include both volatile and nonvolatile, removable and non-removable media implemented in any method or technology for storage of information such as computer-readable instructions, data structures, program modules or other data. Computer storage media are non-transitory and include, but are not limited to, random access memory (RAM), read only memory (ROM), electrically erasable programmable ROM (EEPROM), compact disk ROM (CD-ROM), digital versatile disks (DVD), or other optical disk storage, solid state drives (SSDs), magnetic cassettes, magnetic tape, magnetic disk storage, or other magnetic storage devices, or any other medium that can be used to carry or store desired non-transitory information in the form of computer-executable instructions or data structures and that can be accessed by a computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general-purpose computer, special purpose computer, or special purpose processing device to perform a certain function or group of functions.

The following discussion is intended to provide a brief, general description of a suitable computing environment in which aspects of the disclosure may be implemented. Although not required, aspects of the disclosure will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represent examples of corresponding acts for implementing the functions described in such steps.

Those skilled in the art will appreciate that aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing aspects of the disclosure includes a special purpose computing device in the form of a conventional computer, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory includes computer storage media, including nonvolatile and volatile memory types. A basic input/output system (BIOS), containing the basic routines that help transfer information between elements within the computer, such as during start-up, may be stored in ROM. Further, the computer may include any device (e.g., computer, laptop, tablet, PDA, cell phone, mobile phone, a smart television, and the like) that is capable of receiving or transmitting an IP address wirelessly to or from the internet.

The computer may also include a magnetic hard disk drive for reading from and writing to a magnetic hard disk, a magnetic disk drive for reading from or writing to a removable magnetic disk, and an optical disk drive for reading from or writing to removable optical disk such as a CD-ROM or other optical media. The magnetic hard disk drive, magnetic disk drive, and optical disk drive are connected to the system bus by a hard disk drive interface, a magnetic disk drive-interface, and an optical drive interface, respectively. The drives and their associated computer-readable media provide nonvolatile storage of computer-executable instructions, data structures, program modules, and other data for the computer. Although the exemplary environment described herein employs a magnetic hard disk, a removable magnetic disk, and a removable optical disk, other types of computer readable media for storing data can be used, including magnetic cassettes, flash memory cards, digital video disks, Bernoulli cartridges, RAMs, ROMs, SSDs, and the like.

Communication media typically embody computer readable instructions, data structures, program modules or other data in a modulated data signal such as a carrier wave or other transport mechanism and includes any information delivery media.

Program code means comprising one or more program modules may be stored on the hard disk, magnetic disk, optical disk, ROM, and/or RAM, including an operating system, one or more application programs, other program modules, and program data. A user may enter commands and information into the computer through a keyboard, pointing device, or other input device, such as a microphone, joy stick, game pad, satellite dish, scanner, or the like. These and other input devices are often connected to the processing unit through a serial port interface coupled to the system bus. Alternatively, the input devices may be connected by other interfaces, such as a parallel port, a game port, or a universal serial bus (USB). A monitor or another display device is also connected to the system bus via an interface, such as a video adapter. In addition to the monitor, personal computers typically include other peripheral output devices (not shown), such as speakers and printers.

One or more aspects of the disclosure may be embodied in computer-executable instructions (i.e., software), routines, or functions stored in system memory or nonvolatile memory as application programs, program modules, and/or program data. The software may alternatively be stored remotely, such as on a remote computer with remote application programs. Generally, program modules include routines, programs, objects, components, data structures, etc. that perform particular tasks or implement particular abstract data types when executed by a processor in a computer or other device. The computer executable instructions may be stored on one or more tangible, non-transitory computer readable media (e.g., hard disk, optical disk, removable storage media, solid state memory, RAM, etc.) and executed by one or more processors or other devices. As will be appreciated by one of skill in the art, the functionality of the program modules may be combined or distributed as desired in various embodiments. In addition, the functionality may be embodied in whole or in part in firmware or hardware equivalents such as integrated circuits, application specific integrated circuits, field programmable gate arrays (FPGA), and the like.

The computer may operate in a networked environment using logical connections to one or more remote computers. The remote computers may each be another personal computer, a tablet, a PDA, a server, a router, a network PC, a peer device, or other common network node, and typically include many or all of the elements described above relative to the computer. The logical connections include a local area network (LAN) and a wide area network (WAN) that are presented here by way of example and not limitation. Such networking environments are commonplace in office-wide or enterprise-wide computer networks, intranets and the Internet.

When used in a LAN networking environment, the computer is connected to the local network through a network interface or adapter. When used in a WAN networking environment, the computer may include a modem, a wireless link, or other means for establishing communications over the wide area network, such as the Internet. The modem, which may be internal or external, is connected to the system bus via the serial port interface. In a networked environment, program modules depicted relative to the computer, or portions thereof, may be stored in the remote memory storage device. It will be appreciated that the network connections shown are exemplary and other means of establishing communications over wide area network may be used.

Preferably, computer-executable instructions are stored in a memory, such as the hard disk drive, and executed by the computer. Advantageously, the computer processor has the capability to perform all operations (e.g., execute computer-executable instructions) in real-time.

The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Embodiments of the disclosure may be implemented with computer-executable instructions. The computer-executable instructions may be organized into one or more computer-executable components or modules. Aspects of the disclosure may be implemented with any number and organization of such components or modules. For example, aspects of the disclosure are not limited to the specific computer-executable instructions or the specific components or modules illustrated in the figures and described herein. Other embodiments of the disclosure may include different computer-executable instructions or components having more or less functionality than illustrated and described herein.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements. Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A control system for an industrial plant, comprising:
   one or more processors; and
   a storage unit communicatively coupled to the one or more processors and storing processor-executable instructions thereon that, when executed by the one or more processors, cause the control system to:
   perform a process that inputs data from a plurality of engineering data sources for the industrial plant;
   perform a process that extracts one or more assets of the industrial plant from the data;
   perform a process that creates an HMI (human-machine interface) asset model from the assets, the HMI asset model arranging the assets in a hierarchical structure;
   perform a process that generates an HMI display from the HMI asset model, the HMI display displaying symbols that represent the one or more assets of the industrial plant and lines that represent processes, connections, and data links between the assets; and
   perform a process that displays the HMI display to a user and allows the user to navigate vertically and horizontally along the display, wherein the HMI display dynamically changes which assets are displayed based on a change in position of the user on the HMI display, wherein asset relationships are established from the one or more assets of the industrial plant to create a plant asset registry and build an asset hierarchy, an ontological knowledge base is generated from the plant asset hierarchy, and the process to create the HMI asset model is for an HMI for controlling an industrial process, wherein the model is created from the one or more assets of the industrial plant, the plant asset hierarchy, and the ontological knowledge base.

2. The control system of claim 1, wherein the processor-executable instructions further cause the control system to perform a process that identifies all alarms currently raised for the industrial plant and assets corresponding to the alarms and displays the alarms on the HMI display.

3. The control system of claim 1, wherein the processor-executable instructions further cause the control system to perform a process that displays the HMI display at a plant level, the plant level displaying all currently raised alarms identified for the industrial plant and assets corresponding to the alarms.

4. The control system of claim 1, wherein the processor-executable instructions further cause the control system to perform a process that determines and displays on the HMI display assets that are potential root causes for an alarm upon the user selecting an asset corresponding to one of the alarms.

5. The control system of claim 4, wherein the control system determines the assets that are potential root causes by finding all assets that are connected to one another that also have an alarm.

6. The control system of claim 5, wherein the processor-executable instructions further cause the control system to perform a process that allows a user to manually correct a root cause of an alarm on the HMI display, and provides the root cause from the user as feedback to the control system.

7. The control system of claim 1, wherein the processor-executable instructions further cause the control system to perform a process that automatically zooms in or zooms out on the assets displayed on the HMI display based on a change in a position of the user on the HMI screen.

8. The control system of claim 1, wherein the processor-executable instructions further cause the control system to perform a process that displays assets in the HMI display as a two-dimensional view, wherein the HMI display allows a user to navigate vertically and horizontally within the two-dimensional view.

9. The control system of claim 1, wherein the processor-executable instructions further cause the control system to perform a process that dynamically changes the assets displayed on the HMI display based on an alarm occurring on an asset.

10. The control system of claim 1, wherein the processor-executable instructions further cause the control system to perform a process that displays assets on the HMI display at runtime based on one of: static weight assigned to an asset based on a position of the asset in an asset hierarchy, and dynamic weight assigned to the asset based on an alarm being raised at the asset.

11. A method for controlling for an industrial plant, comprising:

inputting data from a plurality of engineering data sources for the industrial plant;

extracting one or more assets of the industrial plant from the data;

establishing asset relationships to create a plant asset registry and building an asset hierarchy from the assets;

generating an ontological knowledge base from the asset hierarchy;

creating an HMI (human-machine interface) asset model for an HMI controlling an industrial process from the assets, the asset hierarchy, and the ontological knowledge base, the HMI asset model arranging the assets in a hierarchical structure;

generating an HMI display from the HMI asset model, the HMI display displaying symbols that represent the one or more assets of the industrial plant and lines that represent processes, connections, and data links between the assets; and displaying the HMI display to a user and allowing the user to navigate vertically and horizontally along the display, wherein the HMI display dynamically changes which assets are displayed based on a change in position of the user on the HMI display.

12. The method of claim 11, further comprising identifying all alarms currently raised for the industrial plant and assets corresponding to the alarms and displays the alarms on the HMI display.

13. The method of claim 11, further comprising displaying the HMI display at a plant level, the plant level displaying all currently raised alarms identified for the industrial plant and assets corresponding to the alarms.

14. The method of claim 11, further comprising determining and displaying on the HMI display assets that are potential root causes for an alarm upon the user selecting an asset corresponding to one of the alarms.

15. The method of claim 14, wherein determining the assets that are potential root causes includes finding all assets that are connected to one another that also have an alarm.

16. The method of claim 11, further comprising allowing a user to manually correct a root cause of an alarm on the HMI display, and providing the root cause from the user as feedback to a control system.

17. The method of claim 11, further comprising automatically zooming in or zooming out on the assets displayed on the HMI display based on a change in a position of the user on the HMI screen.

18. The method of claim 11, further comprising displaying assets in the HMI display as a two-dimensional view, and allowing a user to navigate vertically and horizontally within the two-dimensional view.

19. The method of claim 11, further comprising dynamically changing the assets displayed on the HMI display based on an alarm occurring on an asset.

20. The method of claim 11, further comprising displaying assets on the HMI display at runtime based on one of: static weight assigned to an asset based on a position of the asset in an asset hierarchy, and dynamic weight assigned to the asset based on an alarm being raised at the asset.

21. The control system of claim 1, wherein the process that extracts one or more assets of the industrial plant from the data extracts the one or more assets of the industrial plant from the data using machine learning to identify the one or more assets.

22. The method of claim 11, wherein the extracting one or more assets of the industrial plant from the data includes extracting the one or more assets of the industrial plant from the data using machine learning to identify the one or more assets.

* * * * *